United States Patent
Li et al.

(10) Patent No.: US 11,770,119 B2
(45) Date of Patent: Sep. 26, 2023

(54) ACTIVELY TRACKING SWITCHING SPEED CONTROL AND REGULATING SWITCHING SPEED OF A POWER TRANSISTOR DURING TURN-ON

(71) Applicant: Infineon Technologies AG, Neubiberg (DE)

(72) Inventors: Zheming Li, Bayreuth (DE); Mark-Matthias Bakran, Erlangen (DE); Daniel Domes, Ruethen (DE); Robert Maier, Bayreuth (DE); Franz-Josef Niedernostheide, Hagen Am Teutoburger Wald (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/852,785

(22) Filed: Jun. 29, 2022

(65) Prior Publication Data

US 2022/0393675 A1    Dec. 8, 2022

Related U.S. Application Data

(63) Continuation of application No. 17/372,913, filed on Jul. 12, 2021, now Pat. No. 11,444,613.
(Continued)

(51) Int. Cl.
*H03K 17/042* (2006.01)
*H03K 17/04* (2006.01)

(52) U.S. Cl.
CPC ....... *H03K 17/0406* (2013.01); *H03K 17/042* (2013.01); *H03K 17/04206* (2013.01); *H03K 2217/0027* (2013.01)

(58) Field of Classification Search
CPC ......... H03K 17/0406; H03K 17/04206; H03K 2217/0027; H03K 17/042; H03K 17/06;
(Continued)

(56) References Cited

U.S. PATENT DOCUMENTS 5,926,012 A    7/1999  Takizawa et al.
6,121,789 A    9/2000  Liu et al.
(Continued)

FOREIGN PATENT DOCUMENTS

GB    2417149 A    2/2006

OTHER PUBLICATIONS

Extended European Search Report for Application No. EP22177529.9, dated Oct. 25, 2022, 9 pages.
Frank., "Simple Slew-Rate Control Technique Cuts Switching Losses," PCIM Europe 2019. International Exhibition and Conference for Power Electronics, 2019, pp. 1-5.
Handt et al., "Fully Digitised, Quasi-Continuous Working Gate-Drive Unit for 1200V-IGBT," Doi:0.11 09/EPE.2013.6634605, 2021, pp. 1-10.
(Continued)

*Primary Examiner* — Jung Kim
(74) *Attorney, Agent, or Firm* — Harrity & Harrity, LLP

(57) ABSTRACT

A gate driver system includes a gate driver circuit coupled to a gate terminal of a transistor and configured to generate an on-current during a plurality of turn-on switching events to turn on the transistor, wherein the gate driver circuit includes a first driver configured to source a first portion of the on-current to the gate terminal to charge a first portion of the gate voltage and a second driver configured to, during a first boost interval, source a second portion of the on-current to the gate terminal to charge a second portion of the gate voltage; a measurement circuit configured to measure a transistor parameter indicative of an oscillation of a load current for a turn-on switching event; and a controller configured to receive the measured transistor parameter and regulate a length of the first boost interval based on the measured transistor parameter.

8 Claims, 10 Drawing Sheets

Related U.S. Application Data

(60) Provisional application No. 63/197,566, filed on Jun. 7, 2021.

(58) Field of Classification Search
CPC .. H03K 17/08; H03K 17/082; H03K 17/0822; H03K 17/12; H03K 17/122; H03K 17/166; H03K 2217/0036
See application file for complete search history.

(56) References Cited

U.S. PATENT DOCUMENTS

| | | | |
|---|---|---|---|
| 10,461,730 B1 * | 10/2019 | Mariconti | H03K 17/168 |
| 10,819,237 B1 | 10/2020 | Petrina et al. | |
| 11,444,613 B1 | 9/2022 | Li et al. | |
| 2015/0349772 A1 | 12/2015 | Schubert et al. | |

OTHER PUBLICATIONS

Li et al., "Mitigating Drain Source Voltage Oscillation with Low Switching Losses for SiC Power MOSFETs Using FPGA-Conlrolled Active Gate Driver," 2020 22nd European Conference on Power Electronics and Applications (EPE'20ECCEEurope), doi:10.23919/EPE20ECCEEurope43536.2020.9215813 2020, pp. 1-10.

Luedecke et al., "Optimized IGBT Turn-On Switching Performance Using the Full Device Safe Operating Area," PCIM Europe 2019. International Exhibition and Conference for Power Electronics, 2019, pp. 1-8.

Rogers et al., "Digital Active Gate Drives using sequential optimization." Department of Engineering Science, doi:10.1109/APEC. 2016.7468088, 2016, pp. 1650-1656.

* cited by examiner

ACTIVELY TRACKING SWITCHING SPEED CONTROL AND REGULATING SWITCHING SPEED OF A POWER TRANSISTOR DURING TURN-ON

CROSS-REFERENCE TO RELATED APPLICATIONS

This application is a continuation of U.S. patent application Ser. No. 17/372,913 filed on Jul. 12, 2021, issued as U.S. Pat. No. 11,444,613 on Sep. 13, 2022, which claims the benefit of U.S. Provisional Application Ser. No. 63/197,566 filed on Jun. 7, 2021, which are incorporated by reference as if fully set forth.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state.

A power transistor is a power semiconductor device that may be used to drive a load current. There is a turn-on process and a turn-off process for switching the power transistor on and off. During the turn-on process, a gate driver integrated circuit (IC) is used to provide (source) a gate current to the gate of the power transistor in order to charge the gate. In contrast, during the turn-off process, the gate driver IC is used to draw (sink) a gate current from the gate of the power transistor in order to discharge the gate and thus lower the gate voltage.

During the transition from the conductive to the blocking operation of the power transistor, the so-called switching process, both blocking voltage on the power transistor and current flow through the power transistor simultaneously exist for a short time. This leads to the inevitable switching losses. With the aim of highly efficient switching and ever higher switching frequencies, it is necessary to reduce the switching losses of the power transistor.

The switching behavior of the power transistor is set by the control at the control electrode. Simple controls work with voltage-controlled components with two voltage levels and a series resistor. This results in a uniform control behavior which is constant across all operating points of the power transistor. These operating points depend on the following parameters: DC-link voltage $V_{DC}$, drain current $I_D$, the junction temperature of the power transistor $T_J$, and the gate driver voltage applied to the gate $V_{GS}$. However, due to the large operating range in which the power transistor is operated, especially for silicon carbide (SiC) transistors, this results in a control which does not behave optimally for a wide operating range (i.e., for a wide range of operating points).

One of the trade-offs that this behavior poses is between the tendency to oscillate when switching fast (e.g., in the case of a fast turn-on process), especially of unipolar components, and high energy loss when switching the same component slowly (e.g., in the case of a slow turn-on process). In addition to the tendency to oscillate, there is also the risk of an electrical overload of the power transistor due to switching on too quickly. For the electrical overload, a clear switching speed limit can be defined from the technical description of the manufacturer. Due to the large operating range, this limit cannot be optimally exploited for every operating point with a simple control in order to reach the optimal point of the conflict of objectives.

The oscillation is considered undesirable in terms of electromagnetic compatibility or electromagnetic interference. However, it is not easy to set a clear switching speed limit. This switching speed limit value always depends on the soldering environment. Also, with regard to the tendency to oscillate, "simple control" means that the switching process cannot be optimally set for each operating point.

In order to optimize the switching process of modern power electronic switches, including SiC transistors, control devices with two-stage or multi-stage switching speeds are often used. This more complex control can improve the conflict of objectives mentioned above.

The necessary setting of a time duration or a temporal portion of the respective switching speed is strongly dependent on the operating point. As a result of this dependency, a control or regulation should be used that sets the corresponding time duration or temporal portion of a switching stage implemented by the control device for a respective operating point of the power transistor. Therefore, an improved device that enables regulation of a time duration or a temporal portion of a switching stage for each operating point of the power transistor may be desirable.

SUMMARY

One or more embodiments provide a gate driver system configured to drive a transistor between switching states in a power circuit, the gate driver system including: a gate driver circuit coupled to a gate terminal of the transistor and configured to control a gate voltage at the gate terminal in order to drive the transistor between the switching states, the gate driver circuit configured to generate an on-current during a plurality of turn-on switching events to turn on the transistor, wherein the gate driver circuit includes a first driver configured to source a first portion of the on-current to the gate terminal to charge a first portion of the gate voltage, wherein the gate driver circuit includes a second driver configured to, during a first boost interval, source a second portion of the on-current to the gate terminal to charge a second portion of the gate voltage; a measurement circuit configured to measure a transistor parameter indicative of an oscillation of a drain current for a first turn-on switching event during which the transistor is transitioned to an on state; and a controller configured to control the first driver to source the first portion of the on-current and to control the second driver to source the second portion of the on-current, wherein the controller is further configured to receive the measured transistor parameter and regulate a length of the first boost interval based on the measured transistor parameter.

One or more embodiments provide a method of driving a transistor between switching states in a power circuit, the method including: generating an on-current during a plurality of turn-on switching events to control a gate voltage at a gate terminal of the transistor, wherein generating the on-current includes sourcing a first portion of the on-current to the gate terminal to charge a first portion of the gate voltage, and sourcing, during a boost interval, a second portion of the on-current to the gate terminal to charge a second portion of the gate voltage; measuring a transistor parameter indicative of an oscillation of a drain current of the transistor for a first turn-on switching event during which the transistor is transitioned to an on state; activating the first portion of the on-current for a second turn-on switching event; and activating the second portion of the on-current for the second turn-on switching event, including regulating a length of the boost interval based on the measured transistor parameter.

One or more embodiments provide a gate driver system configured to drive a transistor between switching states in a power circuit, the gate driver system including: a gate driver circuit coupled to a gate terminal of the transistor and configured to control a gate voltage at the gate terminal in order to drive the transistor between the switching states, the gate driver circuit configured to generate an on-current during a plurality of turn-on switching events to turn on the transistor, wherein the gate driver circuit includes a first driver configured to source a first portion of the on-current to the gate terminal to charge a first portion of the gate voltage, wherein the gate driver circuit includes a second driver configured to, during a boost interval, source a second portion of the on-current to the gate terminal to charge a second portion of the gate voltage; a measurement circuit configured to measure a transistor parameter indicative of a start of a reverse recovery of the transistor/complementary switch for a turn-on switching event during which the transistor is transitioned to an on state; and a controller configured to control the first driver to source the first portion of the on-current and to control the second driver to source the second portion of the on-current, wherein the controller is further configured to receive the measured transistor parameter and regulate a trigger time of the boost interval based on the measured transistor parameter indicating the start of the reverse recovery of the transistor, wherein the trigger time of the boost interval is a time at which the second driver initiates sourcing of the second portion of the on-current to the gate terminal.

One or more embodiments provide a method of driving a transistor between switching states in a power circuit, the method including: generating an on-current during a plurality of turn-on switching events to control a gate voltage at a gate terminal of the transistor, wherein generating the on-current includes sourcing a first portion of the on-current to the gate terminal to charge a first portion of the gate voltage, and sourcing, during a boost interval, a second portion of the on-current to the gate terminal to charge a second portion of the gate voltage; measuring a transistor parameter indicative of a start of a reverse recovery of the transistor for a turn-on switching event during which the transistor is transitioned to an on state; activating the first portion of the on-current for the turn-on switching event; and activating the second portion of the on-current for the turn-on switching event, including regulating a trigger time of the boost interval based on the measured transistor parameter indicating the start of the reverse recovery of the transistor, wherein the trigger time of the boost interval is a time at which the second portion of the on-current to the gate terminal is initiated during the turn-on switching event.

One or more embodiments provide gate driver system configured to drive a load, the gate driver system configured to drive a half bridge circuit including a first transistor and a second transistor that are switched in a complementary manner. The gate driver system includes a gate driver circuit coupled to a gate terminal of the second transistor and configured to control a gate voltage at the gate terminal in order to drive the second transistor between switching states of the second transistor, the gate driver circuit configured to generate an on-current during a plurality of switching events to turn on the second transistor, wherein the gate driver circuit includes a first driver configured to source a first portion of the on-current to the gate terminal to charge a first portion of the gate voltage, wherein the gate driver circuit includes a second driver configured to, during a first boost interval, source a second portion of the on-current to the gate terminal to charge a second portion of the gate voltage; and a measurement circuit configured to measure a transistor parameter of the first transistor during a first switching event during which the first transistor is transitioned to an off state and the second transistor is transitioned to an on state, wherein the transistor parameter is indicative of an oscillation at the second transistor during the first switching event, wherein the measurement circuit is configured to generate a signal that indicates whether or not the oscillation is present at the second transistor during the first switching event based on the measured transistor parameter of the first transistor.

BRIEF DESCRIPTION OF THE DRAWINGS

Embodiments are described herein making reference to the appended drawings.

DETAILED DESCRIPTION

Figure 1:
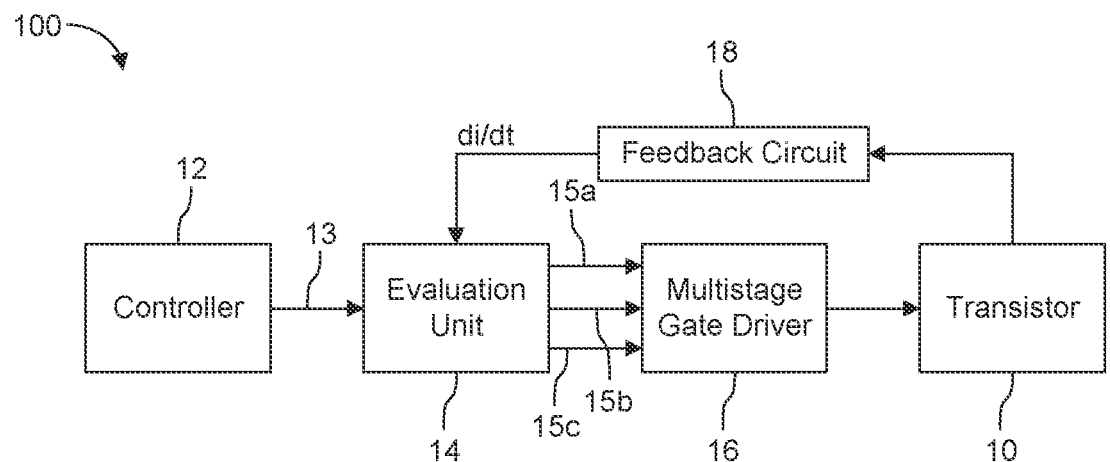
FIG. 1 is a schematic block diagram of a gate driver system with slew-rate control (SRC) according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies, power modules, and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an n-channel IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate voltage sufficiently to turn off the device. Current Io– is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches approximately 0V or a negative driving value. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). It will be appreciated that MOSFETs may be substituted for IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges comprising a first power transistor and a second, complementary power transistor, may be used for driving electric motors or switched mode power supplies. The first power transistor may be referred to as a high-side transistor and the second power transistor may be referred to as a low-side transistor.

The first power transistor, when ON, is responsible for conducing load current in order to source the load current to the load while its complementary power transistor is turned off (i.e., the second power transistor is in blocking mode). In order to sink load current from the load, the roles of the two transistors are reversed. Here, the second power transistor, when ON, is responsible for conducing load current in order to sink the load current from the load while its complementary power transistor is turned off (i.e., the first power transistor is in blocking mode). The power transistor that is switched ON for either sourcing or sinking load current is referred to as the active power transistor, whereas the power transistor that is switched off while the other is switched on is referred to as the complementary power transistor or the passive power transistor.

The roles between the two half-bridge power transistors change in a complementary manner, where one power transistor is the active power transistor and the other power transistor is the passive power transistor depending on whether load current is being sourced to or sinked from the load. Thus, both power transistors operate as the active power transistor and as the passive power transistor, with the first power transistor being the active power transistor and the second power transistor being the passive power transistor while load current is provided to the load and with the first power transistor being the passive power transistor and the second power transistor being the active power transistor while load current is drawn from the load.

As an example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementarily to the each other for driving a phase load.

FIG. 1 is a schematic block diagram of a gate driver system 100 with slew-rate control (SRC) according to one or more embodiments. The gate driver system 100 includes a power transistor 10, control circuitry, and gate driver circuitry that implements a scheme for SRC of the power transistor 10 during turn-on and turn-off. In particular, different switching speeds, and thus different slew-rates, can be implemented for both turn-on and turn-off of the power transistor 10 (i.e., during a switching transition). The power transistor may be implemented as either a low-side transistor or a high-side transistor in a half-bridge circuit. Moreover, for a half-bridge circuit, the gate driver system 100 can be provided in duplicate, where the gate driver system 100 is provided for both high-side and low-side transistors.

The gate driver system 100 includes a controller 12, an evaluation unit 14, a multistage gate driver 16, the transistor 10, and a feedback circuit 18. The controller 12 may be a microcontroller that generates a control signal 13 for controlling a switching state of the transistor 10. For example, the control signal 13 may be a pulse-width modulation (PWM) control signal that provides switch-on and switch-off commands to the evaluation unit 14. Alternatively, the control signal 13 may represent one of two separate control signals, including one switch-on control signal and one switch-off control signal. As used herein, the term "switch-on" may be used interchangeably with the term "turn-on" when referring to switching on a transistor. Similarly, as used herein, the term "switch-off" may be used interchangeably with the term "turn-off" when referring to switching off a transistor.

A multilevel control signal of three or more levels may allow for different levels (e.g., speed stages or speed levels) of switch-on or switch-off to be implemented. For example, a multilevel control signal with four possible levels (e.g., voltage levels) may be able to indicate two different turn-off switching speed stages and two different turn-on switching speed stages. Similarly, if two separate control signals are used for turn-on and turn-off control, each may be implemented as a multilevel control signal where each level corresponds to a different switching speed stage. For example, a multilevel switch-off command having two possible levels may be used to indicate two different turn-off switching speed stages. Thus, one of two different turn-off switching speed stages may be activated according to the control signal 13. It will also be appreciated that three or more speed stages may be used for both turn-on and turn-off.

The evaluation unit 14 is configured to receive the control signal 13 and control the multistage gate diver 16 based thereon. In one example, the evaluation unit 14 may be an FPGA or other processing circuit. In particular, the evaluation unit 14 may activate or deactivate one or more switching speed stages for turn-on and/or turn-off based on the control signal 13. In addition, the evaluation unit 14 further receives feedback information (e.g., di/dt) and further controls a duration or temporal portion of one or more of the turn-on switching speed stages. Thus, the evaluation unit 14 controls a timing of one or more turn-on switching speed stages based on the control signal 13.

A turn-on switching stage provides an ON current (i.e., current Io+) to the control terminal (i.e., the gate terminal) of the power transistor 10. One or more turn-on switching speed stages may be activated to regulate the ON current, and thus, regulate the turn-on switching speed and slew rate of the power transistor 10. Here, the slew rate may refer to the slope of the drain-source voltage $V_{DS}$ of the power transistor or to the slope of the drain current $i_D$. The slew rates of both $V_{DS}$ and $i_D$ are regulated. The drain current may be referred to as a load current and the drain-source voltage $V_{DS}$ may be referred to as a voltage across the load terminals of a transistor. For an IGBT, the voltage across the load terminals is the collector-emitter voltage $V_{CE}$.

For example, the slew rate control for turn-on may be divided into two or more main intervals. In the case of two main intervals, a boost-on interval and a turn-on interval are provided. A different constant ON current received at the gate terminal of the power transistor 10 is maintained for each interval. In the case of more than two main intervals, a first boost-on interval, a second boost-on interval, and a turn-on interval may be provided. A first constant ON current may be received at the control terminal of the power transistor 10 for each of the boost-on intervals and a second, different, constant ON current may be received at the gate terminal of the power transistor 10 for the turn-on interval.

Similarly, the slew rate control technique uses a boost-off interval and a turn-off interval. The boost-on interval and the boost-off interval may generally be referred to as boost intervals, whereas the turn-on interval and the turn-off interval may generally be referred to as switching state intervals.

The boost-on current loads the gate terminal of a power transistor so that the gate voltage is sufficient to turn on the transistor 10. Alternatively, the boost-on current may be a preboost-on current that loads the gate terminal of a power transistor so that the gate voltage is close, but still below the gate threshold voltage needed to turn on the transistor. This is realized by applying a gate current amplitude (i.e., a boost level) for the boost-on interval. Thus, the gate terminal is charged to a turn-on voltage for boost or precharged to a pre-turn-on voltage for preboost. An individual and automated adjustment of the turn-on process, and particularly a first boost-on duration $T_{B1}$ or a temporal component thereof, according to the operating point (e.g., DC link voltage, temperature, and/or load current) of the power transistor 10 is desired in order to achieve the optimal performance of the power transistor. Additionally, or alternatively, a second boost-on duration $T_{B2}$ may be implemented to accelerate the dv/dt phase of the turn-on process. The second boost-on duration $T_{B2}$ may be implemented in combination with the first boost-on duration $T_{B1}$, where the second boost-on duration $T_{B2}$ follows the first boost-on duration $T_{B1}$ of same turn-on switching event or process. Alternatively, only one of the first boost-on duration $T_{B1}$ and second boost-on duration $T_{B2}$ may be implemented.

The first and the second boost-off durations $T_{B1}$ and $T_{B2}$ may be referred to as acceleration durations, as boost durations, as boost times, as boost intervals, or the like. A turn-on switching event is a control period during which the transistor 10 is transitioned from off to on (i.e., a turn-on switching process) and maintained in an on state. Thus, a turn on switching event takes place between two turn-off switching events during which the transistor 10 is transitioned from on to off (i.e., turned off) and maintained in an off state.

The turn-on current level may be applied during the turn-on interval. The amplitude of the turn-on current is often lower than the boost-on current amplitude but is sufficient to turn on the transistor and/or keep the transistor turned on. Whether or not a boost-on current for accelerated turn-on switching is used may be indicated by the control signal 13.

In contrast, a turn-off switching stage sinks an off current (i.e., current Io−) from the control terminal (i.e., the gate terminal) of the power transistor 10. One or more turn-off switching speed stages may be activated to regulate the off current and the gate voltage, and thus, regulate the turn-off switching speed and slew rate of the power transistor.

In particular, a boost-off current may discharge the gate terminal so that the gate voltage is sufficient to turn off the transistor 10. Alternatively, the boost-off current may be a preboost-off current that discharges the gate terminal of a power transistor so that the gate voltage is close, but still above the pinch-off voltage so that the transistor is still on. Subsequently, the turn-off current level is applied during the turn-off interval in order to turn off the transistor. The amplitude of the turn-off current is often lower than the boost-off current amplitude but is sufficient to turn off the transistor and/or keep the transistor turned off. Whether or not a boost-off current for accelerated turn-off switching is used may be indicated by the control signal 13.

The turn-off process of power transistors is often dominated by a longer turn-off propagation delay time. The propagation delay is dominating the dimensioning of the dead time in half-bridge configurations. Since no energy is transferred to the load of power electronic converters, it is a target to reduce the dead time as much as possible. An individual and automated adjustment of the turn-off process, and particularly the boost-off duration or a temporal component thereof, according to the operating point of the power transistor 10 is desired in order to achieve the optimal performance of the power transistor. The boost-off duration may be referred to as an acceleration duration, a boost duration, a boost time, or a boost interval.

The evaluation unit 14 is configured to determine whether a boost-on current is used and which turn-on switching stage is to be activated for the boost phase based on the control signal 13. In addition, the feedback information (e.g., di/dt) is representative of the real-time operating point of the transistor 10. The evaluation unit 14 uses the feedback information (e.g., di/dt) of a current turn-on switching event to determine a time duration or temporal portion for a first boost phase ($T_{B1}$) to be used for a next turn-on switching event. Alternatively, or additionally, the evaluation unit 14 uses the feedback information (e.g., di/dt) of the current turn-on switching event to determine a time duration or temporal portion for a second boost phase ($T_{B2}$) to be used for the current turn-on switching event. Additionally, there can be more than two boost phases for a turn-on switching event.

The switch turn-on process for a turn-on switching event starts with a di/dt phase, during which the load current from the passive transistor (the transistor being turned off) commutates into the active transistor (i.e., the transistor being turned on) and the passive transistor does not yet take any voltage from the active transistor. The entire switch turn-on process includes the di/dt phase and a subsequent dv/dt phase, during which the current commutation has already ended and the passive transistor takes over the voltage from the active transistor.

Control of the first boost phase ($T_{B1}$) is used to decrease the turn-on time for the next turn-on switching event while reducing or preventing oscillation in the drain current $I_D$ (i.e., load current) of the transistor 10 for the next turn-on switching event. Of course, the turn-on time refers to turning on the active transistor and reducing or preventing oscillation in the drain current $I_D$ refers to the drain current of the active transistor during turn on. Specifically, the first boost phase ($T_{B1}$) is used to accelerate the di/dt phase of a turn-on switching event with the duration of the first boost phase ($T_{B1}$) being calculated from the feedback information measured during a previous turn-on switching event of the active transistor. The first boost phase ($T_{B1}$) may be triggered synchronously with the turn-on current generated by a primary driver, but its duration between turn-on switching events may vary based on the feedback information.

Control of the second boost phase ($T_{B2}$) is used to decrease the turn-on time for the current turn-on switching event. Specifically, the second boost phase ($T_{B2}$) is used to accelerate the dv/dt phase of a turn-on switching event of the active transistor with the timing of the second boost phase ($T_{B2}$) being triggered by based on the feedback information measured during the current turn-on switching event. Thus, the feedback information measured during the current turn-on switching event is used to trigger the second boost phase ($T_{B2}$) of the same, current turn-on switching event. The duration of the second boost phase ($T_{B2}$) may be preconfigured and may be constant for all turn-on switching events. However, the timing at which the second boost phase ($T_{B2}$) is triggered may vary based on the feedback information.

In addition, it is possible that two or more turn-on switching stages at different drivers may be used. The two or more turn-on stages may be activated and deactivated synchronously, activated synchronously and deactivated asynchronously, or activated and deactivated asynchronously. For example, two turn-on stages may be activated at the same time and deactivated sequentially based on different deactivation times. Furthermore, each turn-on stage may be activated for a same duration or for different durations.

The multistage gate driver 16 includes multiple control stages for turn-on and turn-off of the transistor 10. As explained above, different turn-on and turn-off switching stages may be used to control how quickly the transistor 10 turns on and off. Thus, each switching stage corresponds to a different switching speed that regulates the slew rate of the transistor 10 during a switching event (i.e., during a turn-on or turn-off transient).

The feedback circuit 18 is configured to measure a characteristic of the power transistor 10 in order to derive the time derivative of the switching current (i.e., load current) of the transistor 10. Thus, the feedback circuit 18 measures the feedback information (e.g., di/dt), where the switching current is the drain current $I_D$ or the load current. Thus, the time derivative of the switching current may also be referred to as a time derivative switching current $di_D/dt$. As will be described below, the time derivative of the switching current may be derived from measuring a voltage across a stray inductance included in the load path and coupled in series to the power transistor 10. According to Ohm's Law ($di_D/dt=\Delta V/L$), the voltage difference $\Delta V$ across the stray inductance is proportional to $di_D/dt$ and this voltage difference $\Delta V$ can be compared to one or more thresholds for regulating the first and second boost phases. In other words, $\Delta V$ can be used as a representation of $di_D/dt$.

Figure 2A:
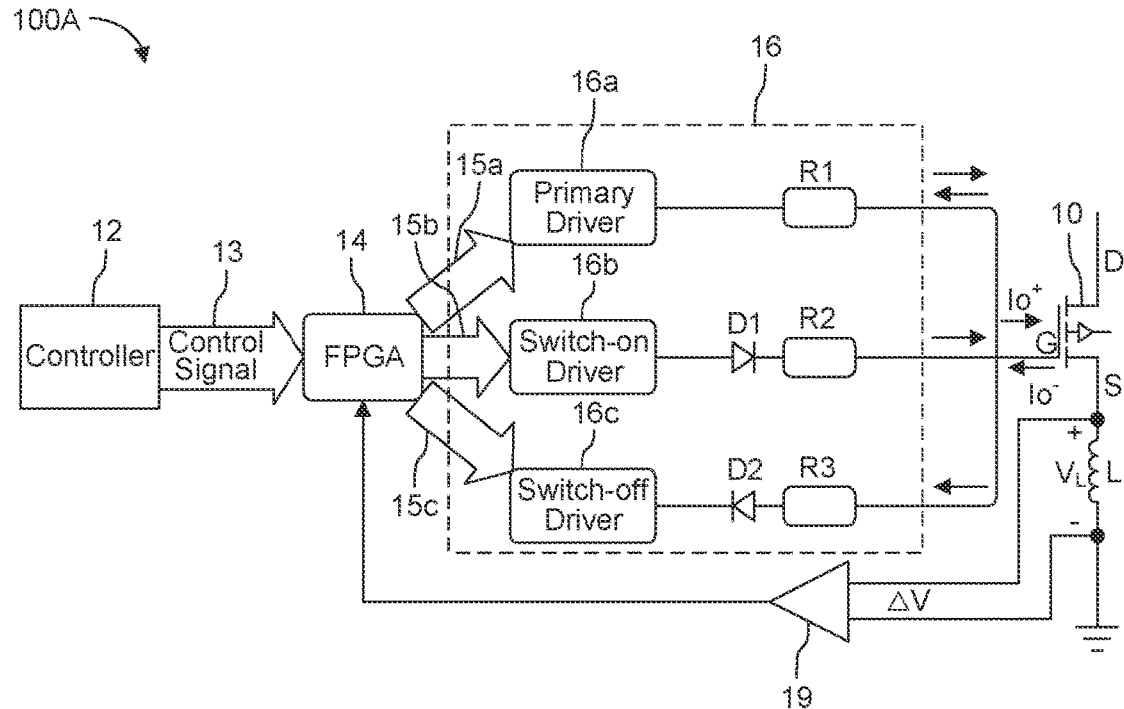
FIG. 2A is a schematic diagram of the gate driver system with a measurement circuit according to one or more embodiments.
Figure 2B:
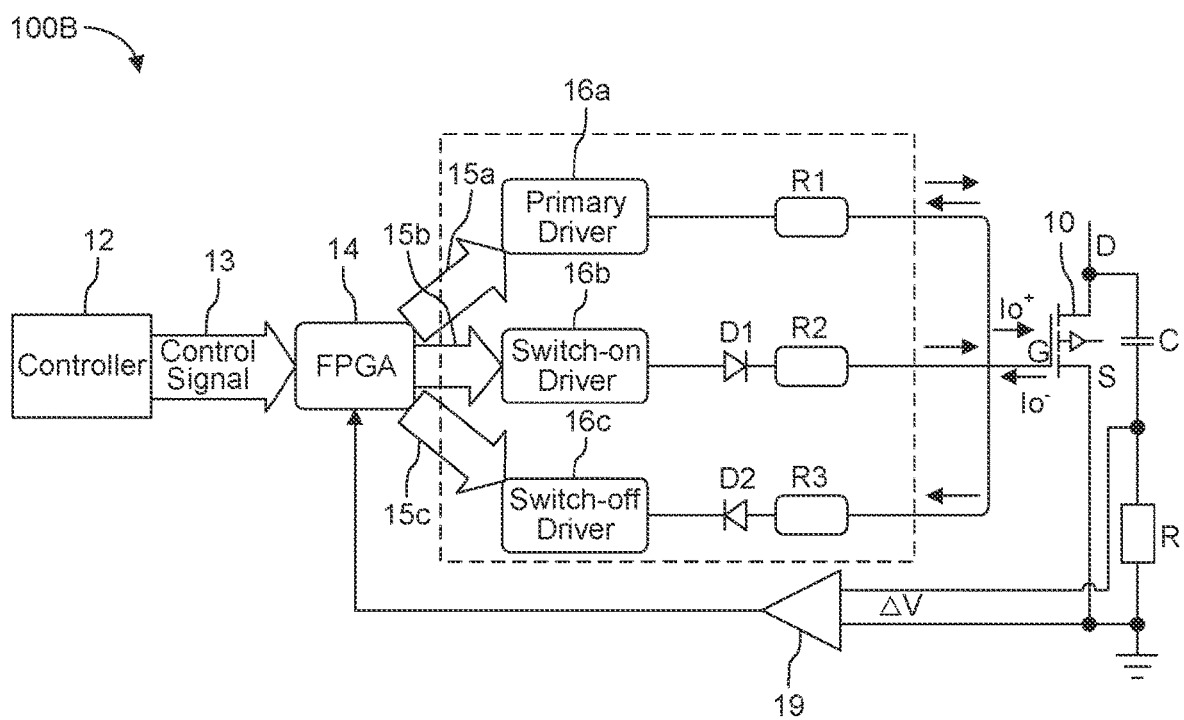
FIG. 2B is a schematic diagram of the gate driver system with another measurement circuit according to one or more embodiments.
Figure 2C:
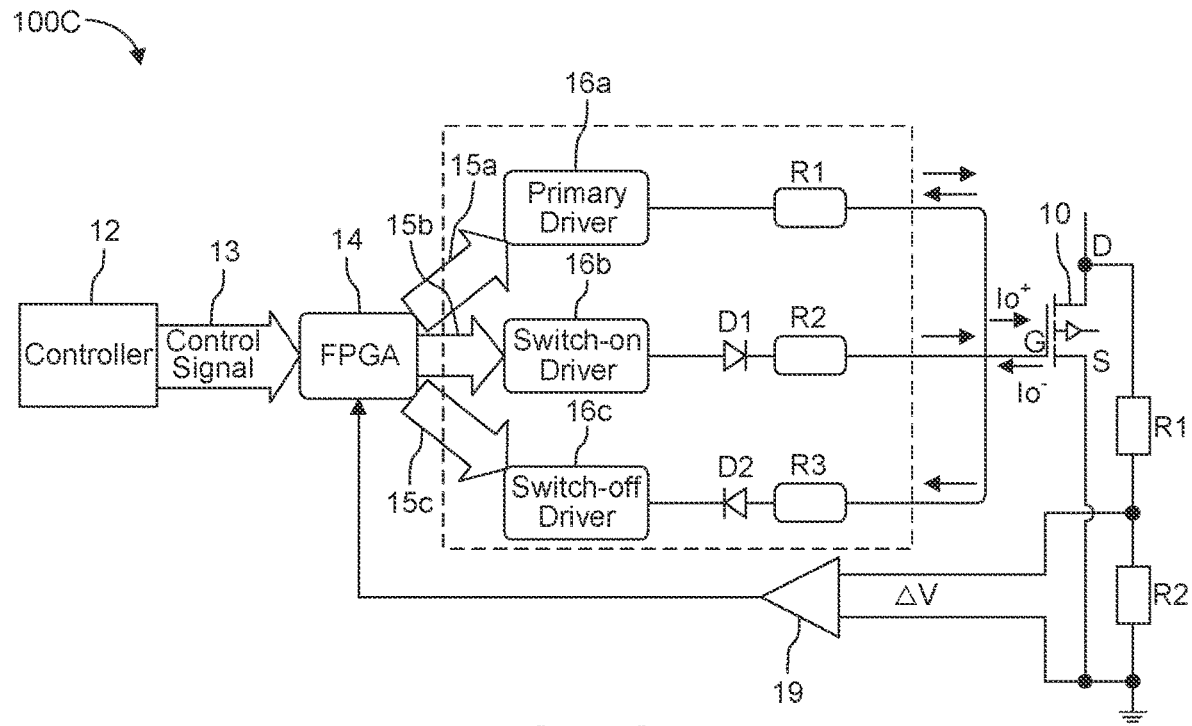
FIG. 2C is a schematic diagram of the gate driver system with another measurement circuit according to one or more embodiments.
Figure 2D:
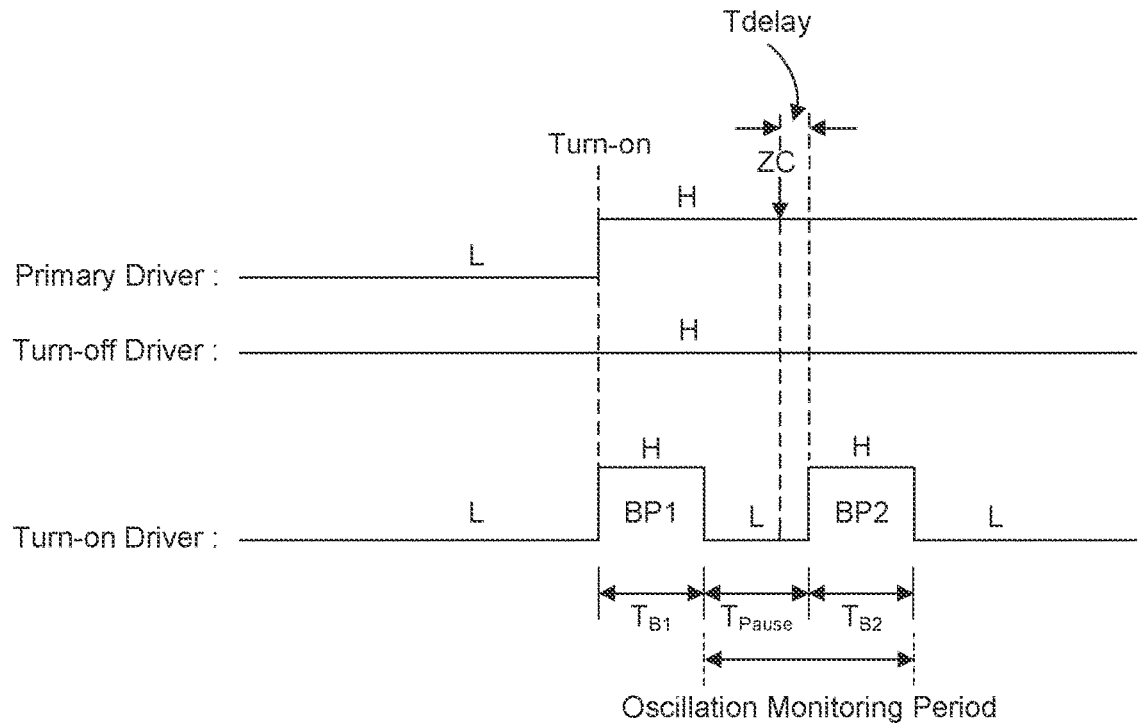
FIG. 2D is a waveform diagram of a control voltages generated by the drivers of the multistage gate driver during turn-on of a power transistor according to one or more embodiments.

FIG. 2A is a schematic diagram of the gate driver system 100A including a measurement circuit according to one or more embodiments. FIG. 2B is a schematic diagram of the gate driver system 100B including another type of measurement circuit according to one or more embodiments. FIG. 2C is a schematic diagram of the gate driver system 100C including another type of measurement circuit according to one or more embodiments. FIG. 2D is a waveform diagram of a control voltages generated by the drivers of the multistage gate driver 16 during turn-on of the power transistor 10 according to one or more embodiments.

The multistage gate driver 16 of the present example is illustrated using the example of a two-stage control for turn-on. The two turn-on stages are implemented by two separately controllable series resistors R1 and R2. Similarly, two turn-off stages are implemented by two separately controllable series resistors R1 and R3.

In general, the gate driver system 100A measures a time derivative of the switching current $di_D/dt$ (e.g., $\Delta V$) and compares the time derivative switching current $di_D/dt$ with a negative trigger threshold (e.g., a negative overshoot threshold) to determine a comparison result. Based on the comparison result, the gate driver system 100A adapts a boost duration $T_{B1}$ or a temporal portion of an accelerated turn-on stage during which the accelerated turn-on stage is activated, thereby adapting its respective switching speed.

The multistage gate driver 16 includes a primary driver 16a (i.e., a turn-on/off stage) configured to control a turn-on and turn-off of the power transistor 10. The multistage gate driver 16 further includes a switch-on driver 16b (i.e., a turn-on boost stage) configured to accelerate or boost the turn-on time of the transistor 10. Thus, the switch-on driver 16b supplements the turn-on function of the primary driver 16a by implementing a faster switching speed than the primary driver 16a. The multistage gate driver 16 further includes a switch-off driver 16c (i.e., a turn-off stage) configured to accelerate or boost the turn-off time of the transistor 10. Thus, the switch-off driver 16c supplements the turn-off function of the primary driver 16a by implementing a faster switching speed than the primary driver 16a.

The control signal 13 for changing the switching state of the transistor 10 is processed by the evaluation unit 14. The evaluation unit 14 may be a fast FPGA or other gate driver controller that controls the gate driver stages of the multistage gate driver 16. The evaluation unit 14 generates driver control signals 15a, 15b, 15c that control one of the respective drivers 16a, 16b, and 16c. Thus, the turn-on and turn-off functionally for transistor 10 driven by the drivers 16a, 16b, and 16c can be activated and deactivated according to these control signals 15a, 15b, and 16c. Each of the drivers 16a, 16b, and 16c is configured to generate a low (negative or zero) control voltage or high (positive) control voltage based on their respective driver control signals 15a, 15b, 15c to control the flow of gate current at the power transistor 10.

The primary driver 16a is electrically coupled to very large series resistor R1 and controls slow switching of the transistor 10. This series resistor R1 should preferably be selected at least so large that the switching process fulfills the conflict of objectives at every operating point of the planned operating range. The series resistor R1 with a high value must therefore ensure that a switching process meets oscillation criterion/criteria for all operating points. The oscillation criterion/criteria may mean that the drain-source voltage $V_{DS}$ of the passive transistor, the drain current $i_D$ of the active transistor, and/or a time derivative of the drain current $di_D/dt$ of the active transistor has no oscillation, has substantially no oscillation, or has oscillation that is within a tolerance limit during turn on of the active transistor. For example, the oscillation criterion/criteria may mean that, during turn on of the active transistor, the drain current or the time derivative thereof of the active transistor does not exceed an overcurrent or overshoot limit. Alternatively, the oscillation criterion/criteria may mean that, during turn on of the active transistor, the drain-source voltage $V_{DS}$ or a time derivative thereof of the passive transistor during turn on of the active transistor is within a tolerance limit that does not exceed an overvoltage or overshoot limit. For example, oscillation criterion/criteria may result in a 90% reduction of the oscillation amplitude (peak to peak) in the drain current $i_D$ of the active transistor.

The turn-on driver 16b is electrically coupled to an optional directional diode D1 and a series resistor R2 and controls a faster turn-on switching of the transistor 10. The directional diode D1 allows current to flow to the gate or the transistor 10 but blocks current in the opposite direction. Here, the resistance value of the series resistor R2 may be selected to according to the switching speed provided by the turn-on driver 16b. In general, the series resistor R2 enables a higher gate current Io+ to flow to the gate of the transistor 10, resulting in accelerated gate charging and shorter turn-on times. The turn-on driver 16b may receive control signals 15b for triggering and controlling the duration of boost pulses BP1 and BP2 having respective boost durations (i.e., pulse lengths) $TB_1$ and $TB_2$. The control signal 15b may be a pulsed signal with pulses that correspond to the respective boost pulses BP1 and BP2.

The turn-off driver 16c is electrically coupled to a directional diode D2 and a series resistor R3 and controls a faster turn-off switching of the transistor 10. The directional diode D2 allows current to sink from the gate or the transistor 10 but blocks current in the opposite direction. Here, the resistance value of the series resistor R3 may be selected to according to the switching speed provided by the turn-off driver 16b. In general, the series resistor R3 enables a higher gate current Io- to be drawn from the gate of the transistor 10, resulting in accelerated gate discharging and shorter turn-off times.

To optimize the conflict of objectives, the switch-on driver 16b is briefly switched on during the switch-on process. When both boost pulses BP1 and BP2 are utilized, the switch-on driver 16b is briefly switched on twice during the switch-on process. However, it is also possible to only use one of the boost pulses BP1 or BP2. While switched on, the switch-on driver 16b generates a boost pulse BP1 and/or BP2 at its output (i.e., a pulse of a high control voltage). This leads to an acceleration of the switch-on process since switching is accelerated by the lower resistance provided by the current path of resistance R2. In particular, the evaluation unit 14 switches from a low (negative or zero) control voltage to a high (positive) control voltage via control signals 15a and 15b for the primary driver 16a and for the turn-on driver 16b. As a result of the two drivers 15a and 15b generating a high (positive) control voltage, both the primary driver 16a and the turn-on driver 16b source gate current to the transistor 10 to turn on the transistor 10. Since the turn-off driver 16c is only used for a turn-off boost, its control voltage is already at a high level and the turn-off driver 16c does not participate in the turn-on process. The primary driver 16a maintains this high (positive) voltage level to source gate current and/or maintain the transistor 10 in the on state until the control signal 13 initiates a turn-off switching event.

A boost duration $T_{B1}$ of boost pulse BP1 is determined by the evaluation unit 14. Once the boost duration $T_{B1}$ of the switching acceleration has lapsed, the evaluation unit 14 switches the turn-on driver 16b to a low (negative or zero) control voltage via control signal 15b, ending the boost pulse according to the controlled boost duration $T_{B1}$. Once the control voltage at the turn-on driver 16b is switched low, the directional diode D2 becomes reverse-biased and prevents further current flow (source) to the turn-on driver 16b, so that it no longer participates in the turn-on switching process. In other words, the turn-on switching process is braked to the speed of the control of the primary driver 16a once the turn-on driver 16b is deactivated.

If the evaluation unit 14 has set the boost duration $T_{B1}$ of the acceleration correctly according to the operating point of the transistor 10, a fast switching process can be achieved that meets oscillation criterion (i.e., has no oscillation, has substantially no oscillation, or has oscillation that is within a tolerance limit). On the other hand, if oscillation in the switching current is detected by the evaluation unit 14, the evaluation unit 14 can adjust to the acceleration duration $T_{B1}$ such that the oscillation criterion is satisfied at a subsequent turn-on switching event.

Thus, after the turn-on switching process of a current turn-on switching event, the evaluation unit 14 evaluates the time derivative switching current $di_D/dt$ against oscillation criterion (e.g., against a negative threshold value). A voltage drop $\Delta V$ across a stray inductance L that is coupled in series with the transistor 10 along its load path may be measured as a representation of the time derivative switching current $di_D/dt$. A comparator 19 implemented as part of the feedback circuit 18 may measure the voltage drop $\Delta V$ while also comparing the voltage drop $\Delta V$ to a predetermined negative threshold value. If the voltage drop $\Delta V$ exceeds (i.e., is more negative) than the predetermined negative threshold value, the comparator 19 is configured to output a signal that indicates that the threshold has been exceeded.

In FIG. 2A, the stray inductance L is coupled to a load path terminal of the transistor 10, such as the source terminal. The stray inductance L may be, for example, a wire (e.g., bond wire or printed circuit board conductor line) that acts as a stray inductor. The comparator 19 receives the two voltage values measured across the stray inductance L and generates a comparator output signal that indicates whether or not the instantaneous voltage difference or voltage drop $\Delta V$ across the stray inductance L has exceeded the predetermined negative threshold value. The predetermined negative threshold value can be set based on the known inductance value of the stray inductance L.

Alternatively, the evaluation unit 14 may receive the instantaneous voltage drop $\Delta V$ across the stray inductance L and calculate the instantaneous rate of current change $di_D/dt$ (amps per second) based on the instantaneous voltage drop $\Delta V$ and the known, pre-stored value of the stray inductance L to compare to a threshold value. Thus, the feedback circuit 18 shown in FIG. 1 includes at least the stray inductance L, the comparator 19, and part of the evaluation unit 14 (i.e., a processing circuit) used for evaluating the comparator result. The evaluation unit 14 may also be uses to calculate the time derivative switching current $di_D/dt$. The feedback circuit 18 may also be integrated with the evaluation unit 14.

In FIG. 2B, the feedback circuit 18 includes a capacitor C and a series resistor R circuit that is coupled in parallel to the transistor 10. Here, the comparator 19 implemented as part of the feedback circuit 18 measures a voltage drop $\Delta V$ across the resistor R. The voltage drop $\Delta V$ is then used by the evaluation unit 14 in a similar manner described above.

In FIG. 2C, the feedback circuit 18 includes a voltage divider comprising resistor R1 and R2. The voltage divider is coupled in parallel to the transistor 10. Here, the comparator 19 implemented as part of the feedback circuit 18 measures a voltage drop $\Delta V$ across the resistor R2. The voltage drop $\Delta V$ is then used by the evaluation unit 14 in a similar manner described above.

The evaluation unit 14 then evaluates the output of the comparator 19 to determine whether the first boost pulse BP1 should be adjusted. However, depending on the clock frequency of the application, it may not be time-critical. For example, with a high switching frequency of 40 kHz of the power transistor 10, the evaluation must be done within 25 μs and with lower switching frequencies the time available increases accordingly). Based on the evaluation, the evaluation unit 14 regulates the duration $T_{B1}$ of the switching acceleration (i.e., the amount of time the turn-on driver 16b is activated or the amount of time the turn-on driver 16b generates a high (positive) control voltage at the anode of the directional diode D2 before switching back to a low (negative or zero) control voltage at the anode. By doing so, the evaluation unit 14 regulates the pulse length of boost pulse BP1.

This regulation of the duration $T_{B1}$ of the switching acceleration includes maintaining a current duration setting if the time derivative switching current $di_D/dt$ meets the oscillation criterion or adjusting (e.g., decreasing) the duration setting if the time derivative switching current $di_D/dt$ does not meet or exceeds the oscillation criterion. For example, if the voltage drop $\Delta V$ exceeds (i.e., is more negative) the predetermined negative threshold value, the time derivative switching current $di_D/dt$ does not meet the oscillation criterion. In addition, the evaluation unit 14 may adjust the duration setting by increasing the duration if the time derivative switching current $di_D/dt$ meets the oscillation criterion. For example, if the voltage drop $\Delta V$ does not exceed (i.e., is equal to or greater than) the predetermined negative threshold value, the time derivative switching current $di_D/dt$ meets the oscillation criterion. In this way, by incrementally increasing the duration setting if the oscillation criterion is met and incrementally decreasing the duration setting if the oscillation criterion is not met, an upper limit to the boost duration setting of BP1 can be found based on a measurement of the operating point taken in real-time.

The oscillation criterion may be whether, at any point during the turn-on switching process of a current turn-on switching event, the time derivative switching current $di_D/dt$ exceeds (i.e., becomes more negative) than a negative threshold value Ref1. If the time derivative switching current $di_D/dt$ becomes more negative than a negative threshold value Ref1, the evaluation unit 14 decreases the boost duration $T_{B1}$ by a predetermined amount for the next turn-on switching event. If the time derivative switching current $di_D/dt$ does not exceed (i.e., is more positive than or equal to) the negative threshold value Ref1, the evaluation unit 14 maintains or increases the boost duration $T_{B1}$ by a predetermined amount for the next turn-on switching event. The negative peak of $di_D/dt$ during the turn-on switching process indicates the oscillation intensity. The negative threshold value Ref1 serves as an oscillation limit. When the negative peak of $di_D/dt$ during the turn-on switching process exceeds the negative threshold value Ref1, it means the oscillation limit has been exceeded and the transistor 10 has been switched on too fast. By decreasing the boost duration $T_{B1}$, the switching time can be increased (slowed) for the next turn-on switching event to bring any oscillation back within the oscillation limit.

Figure 3A:
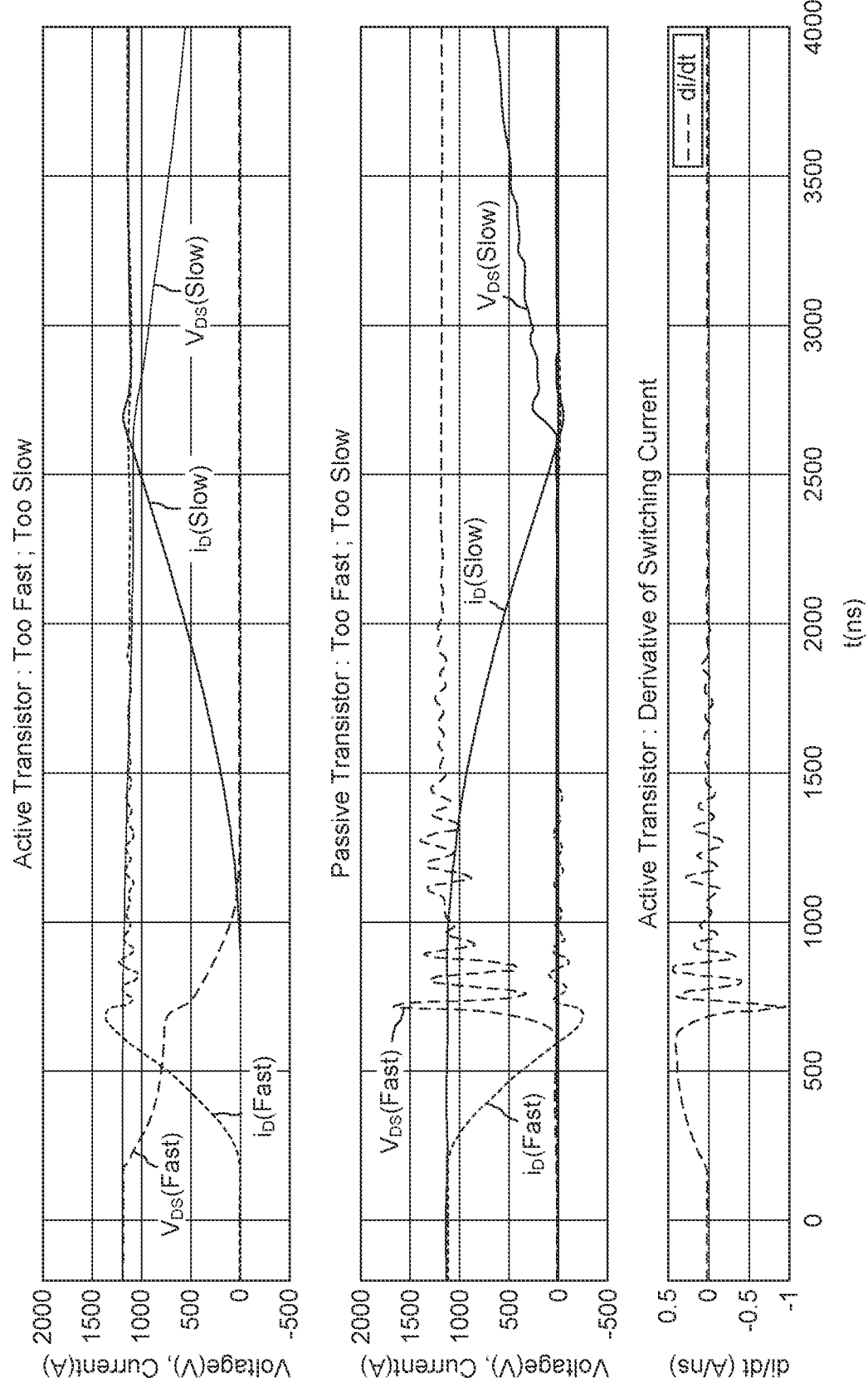
FIG. 3A shows normalized waveforms of the drain-source voltage $V_{DS}$ and drain current $i_D$ using fast switching and slow switching for turn-on of an active power transistor and for turn-off of a passive power transistor without regulating a switching acceleration duration $T_{B1}$ based on a measured operating point.

The top diagram of FIG. 3A shows normalized waveforms of the drain-source voltage $V_{DS}$ and drain current $i_D$ of the active transistor of a half-bridge using fast switching and slow switching for turn-on of the active transistor without regulating a switching acceleration duration $T_{B1}$ based on a measured operating point. The middle diagram of FIG. 3A shows normalized waveforms of the drain-source voltage $V_{DS}$ and drain current $i_D$ of the passive transistor of the half bridge using fast switching and slow switching for turn-on of the active transistor. The bottom diagram of FIG. 3A shows a waveform for the time derivative switching current $di_D/dt$ of the active transistor under a too fast switching condition.

For slow switching, the boost pulse BP1 may not be used at all, leading to high power dissipation (i.e., switching loss) but small oscillation in the drain current $i_D$. The time derivative switching current $di_D/dt$ for slow switching does not violate an oscillation condition. In can also be seen in the middle diagram that only a small oscillation in the drain-source voltage $V_{DS}$ of the passive transistor occurs during the slow switching on of the active transistor.

On the other hand, an unregulated boost pulse BP1 that causes the transistor 10 to switch on too fast causes large oscillation in the drain current $i_D$ of the active transistor, which runs the risk of an electrical overload of the complementary, passive switch (diode) despite lower switching losses when compared to the slow switching process. In can also be seen in the middle diagram that a large oscillation in the drain-source voltage $V_{DS}$ of the passive transistor occurs during the too fast switching on of the active transistor. This large oscillation in the drain-source voltage $V_{DS}$ of the passive transistor can be used to detect a violation of an oscillation condition of the active transistor during turn on of the active transistor.

The time derivative switching current $di_D/dt$ for too fast switching violates an oscillation condition. Specifically, at least one negative peak of the time derivative switching current $di_D/dt$ (e.g., $\Delta V$) exceeds the negative threshold value Ref1, indicating that unacceptable (large) oscillation has occurred. Typically, the first negative peak of the time derivative switching current $di_D/dt$ will have the greatest magnitude. However, the violation of the oscillation criterion occurs when any negative peak of the time derivative switching current $di_D/dt$ (e.g., $\Delta V$) exceeds the negative threshold value Ref1.

Thus, FIG. 3A illustrates the fundamental conflict of objectives with regard to oscillation. This conflict of objectives is improved by optimizing the two-stage gate driver control by using a turn-on boost procedure with an adjusted acceleration duration or boost duration $T_{B1}$ that is regulated based on an evaluation of the time derivative of the switching current $di_D/dt$. Using this turn-on switching technique, a fast switching process that satisfies predetermined oscillation criterion with low switching loss can be achieved.

When switching half-bridges, the drain-source voltage $V_{DS}$ and the drain current $i_D$ of the passive transistor can also experience oscillation when turning on the active transistor. The size of the oscillation of the drain-source voltage $V_{DS}$ or the drain current $i_D$ of the passive transistor can be correlated (e.g., proportional) to the size of the oscillation of the drain current $i_D$ at the active transistor and vice versa. For example, a large oscillation in the drain-source voltage $V_{DS}$ of the passive transistor is indicative of a large oscillation in the drain current $i_D$ of the active transistor, meanwhile smaller or no oscillations in the drain-source voltage $V_{DS}$ of the passive transistor is indicative of a smaller or no oscillations in the drain current $i_D$ of the active transistor.

Additionally, the drain-source voltage $V_{DS}$ or the drain current $i_D$ of the passive transistor can be monitored and evaluated to determine whether there is an oscillation at the active transistor that violates the oscillation criterion. For example, the drain-source voltage $V_{DS}$ of the passive transistor, the drain current $i_D$ of the passive transistor, or the time derivative of the $V_{DS}$ or $i_D$ of the passive transistor can be evaluated against a respective threshold limit or a respective tolerance window as the oscillation criteria for the active transistor. If the drain-source voltage $V_{DS}$ of the passive transistor, the drain current $i_D$ of the passive transistor, or the time derivative of the $V_{DS}$ or $i_D$ of the passive transistor is detected to exceed its respective threshold limit or a respective tolerance window, the evaluation circuit 14 can detect that unacceptable oscillation has occurred at the active transistor during its turn on switching event. In other words, a large oscillation can be detected at the passive transistor during the turn-on of the active transistor. From this oscillation detection at the passive transistor, it can be inferred that a large oscillation in $I_D$ has occurred at the active transistor during the turn-on of the active transistor.

Figure 3B:
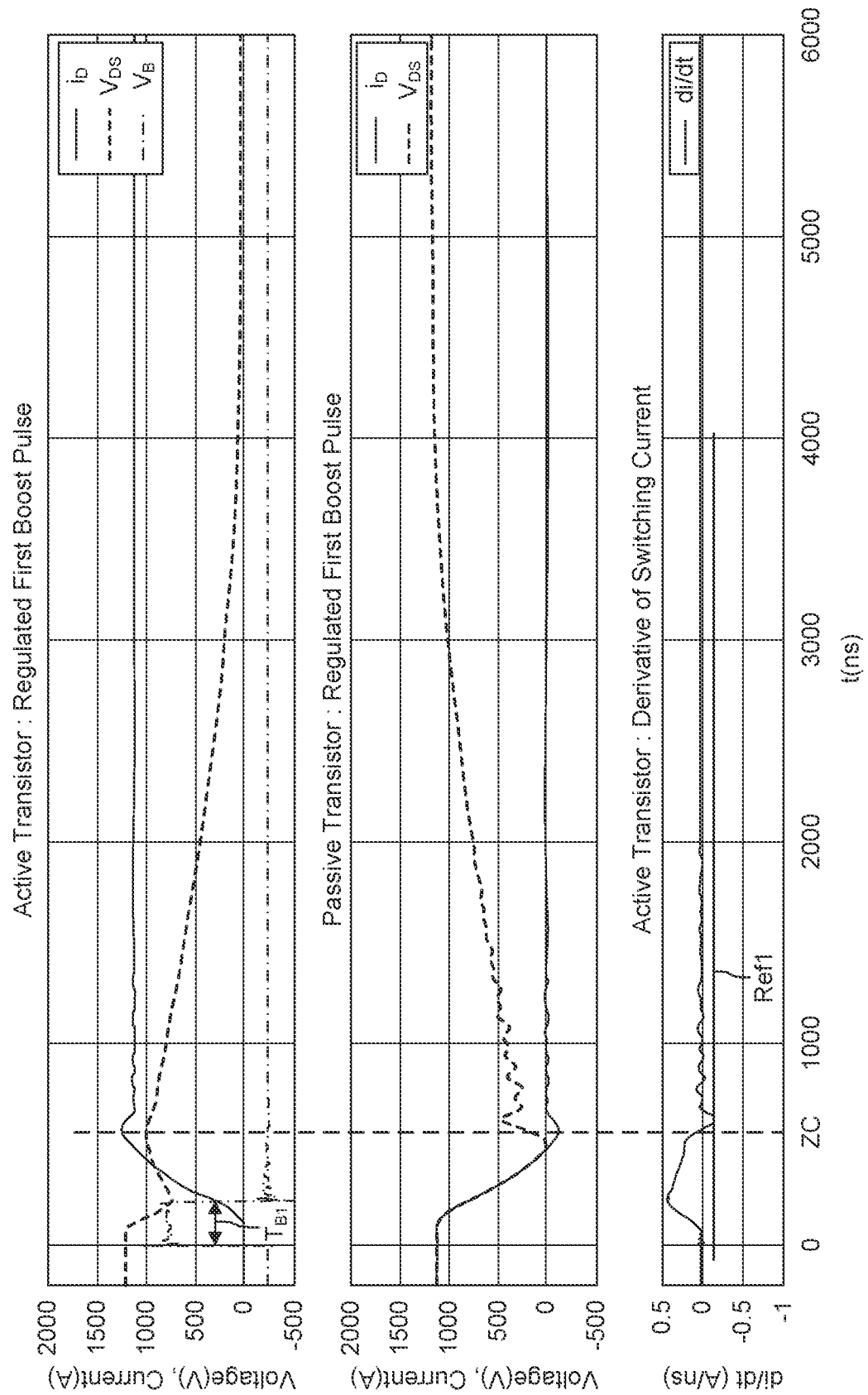
FIG. 3B is directed to a switching event for an active power transistor and a passive power transistor and illustrates normalized waveforms of the drain-source voltage $V_{DS}$ and the drain current $i_D$, as well as illustrates the corresponding time derivative switching current diD/dt of the active power transistor using fast switching and a regulated acceleration duration $T_{B1}$ according to one or more embodiments.

FIG. 3B is directed to a turn-on switching event. The top diagram of FIG. 3B illustrates normalized waveforms of the drain-source voltage $V_{DS}$ and the drain current $i_D$ of the active transistor of a half bridge using fast switching and a regulated acceleration duration $T_{B1}$. The middle diagram of FIG. 3B illustrates normalized waveforms of the drain-source voltage $V_{DS}$ and the drain current $i_D$ of the passive transistor of the half bridge using fast switching and a regulated acceleration duration $T_{B1}$. The bottom diagram of FIG. 3C illustrates the corresponding time derivative switching current $di_D/dt$ of the active transistor using fast switching and a regulated acceleration duration $T_{B1}$ according to one or more embodiments. In particular, the time derivative switching current $di_D/dt$ (e.g., $\Delta V$) is evaluated by a feedback circuit 18 against a negative threshold limit Ref1 and the comparison result evaluated by the evaluation unite 14 to regulate the acceleration duration $T_{B1}$ implemented by the turn-on driver 16b. The normalized equivalent boost voltage VB generated at the gate terminal of transistor 10 by the boost current (e.g., by the boost pulse BP1 for a boost duration $T_{B1}$) is also shown.

As can be seen, in the di/dt phase of the active transistor, the slopes of the drain-source voltage $V_{DS}$ and the drain current $i_D$ are steep, much like the slopes shown in FIG. 3A, indicating fast turn-on switching of the power transistor 10 (i.e., the active transistor). At the same time, the oscillations of the drain-source voltage $V_{DS}$ of the complementary, passive switch and the drain currents $i_D$ of both active and passive transistors are minimized. The threshold limit is a boundary that if exceeded by the time derivative switching current $di_D/dt$ results in the occurrence of unacceptable oscillation. Thus, the threshold limit sets the oscillation criterion for the evaluation.

Therefore, it can be surmised that FIG. 3B illustrates a benefit of setting the duration $T_{B1}$ of the switching acceleration depending on the operating point. A non-optimal boost duration $T_{B1}$ results in either increased oscillation or a significantly slower switching speed.

The evaluation unit 14 is configured to evaluate the time derivative switching current $di_D/dt$ after (e.g., immediately after) a boost pulse BP1 of the turn-on driver 16b (i.e., after the boost time $T_{B1}$), but prior to the next boost pulse BP1. For example, the evaluation unit 14 may detect an end of the boost time $T_{B1}$ of a boost pulse BP1 and initiate an evaluation of the time derivative switching current $di_D/dt$ (e.g., $\Delta V$) in response thereto during an oscillation monitoring period of the current turn-on switching event. The tracked method evaluates the time derivative switching current $di_D/dt$ (e.g., $\Delta V$) against the negative threshold limit Ref1 of the conflicting target values discussed above. The evaluation unit 14 uses the results of the evaluation to regulate the boost time $T_{B1}$ for the next boost pulse BP1 corresponding to the next turn-on switching event of the transistor 10. By doing so, the evaluation unit 14 aims to reduce the oscillation of both the drain-source voltage $V_{DS}$ and the drain-current $i_D$ of the power transistor 10.

Figure 4:
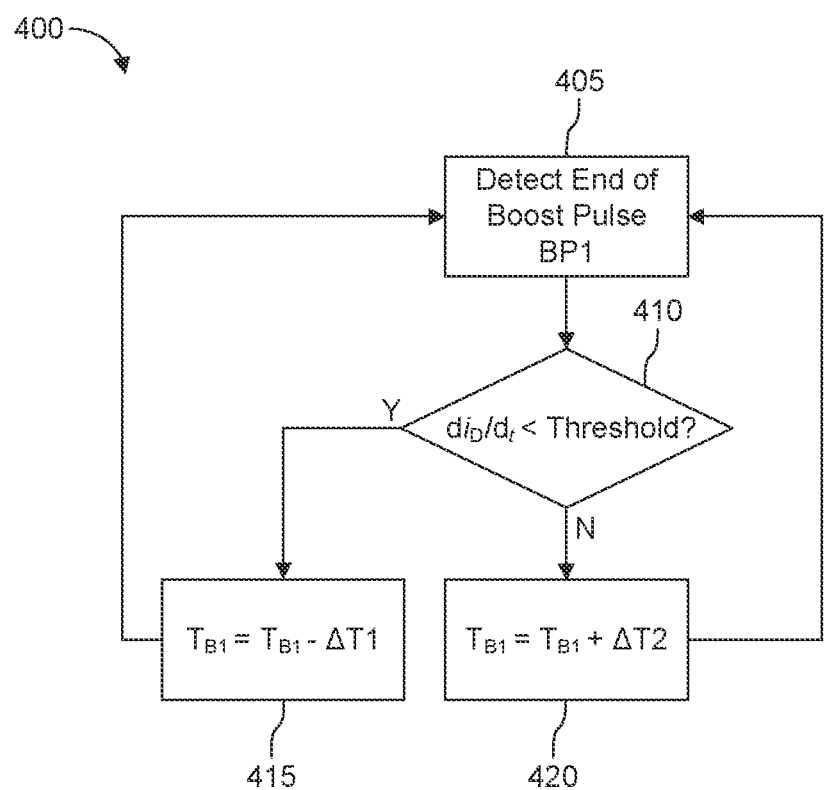
FIG. 4 is a flow diagram for a method of regulating a turn-on boost time $T_{B1}$ according to one or more embodiments.

FIG. 4 is a flow diagram for a method 400 of regulating a turn-on boost time $T_{B1}$ according to one or more embodiments increasing the boost time $T_{B1}$ also increases the tendency for oscillation. Conversely, decreasing the boost time $T_{B1}$ decreases the tendency for oscillation.

It is noted that, if oscillation or a ringing-effect in the drain-source voltage $V_{DS}$ and drain current drain-current $i_D$ exists, the oscillation typically starts after the boost-phase $T_{B1}$ is over. Thus, the end of the boost pulse BP1 can be used by the evaluation unit 14 to trigger the monitoring phase for detecting and/or measuring any oscillation that may be present. Upon detecting an oscillation that does not meet the oscillation criterion, further action by the evaluation unit 14 can be taken.

In operation 405, the evaluation unit 14 detects that a boost time $T_{B1}$ of a boost pulse BP1 has lapsed. Upon detecting the end of the boost time $T_{B1}$, the evaluation unit 14 measures, via feedback circuit 18, and evaluates the time derivative switching current $di_D/dt$ (operation 410). In particular, in operation 410, the feedback circuit 18 measures the time derivative switching current $di_D/dt$ and compares it to a predetermined negative threshold limit Ref1. In one example, $\Delta V$ representative of $di_D/dt$ is compared to the predetermined negative threshold limit Ref1. This measurement and comparing operation is preformed over a predetermined monitoring period, as shown in FIG. 2D. The predetermined monitoring period is after the boost pulse BP1 and is long enough in duration to detect an oscillation, should it be present. At the end of the monitoring period, if no oscillation has been detected, the evaluation unit 14 can arrive at a "no oscillation" decision. Thus, the predetermined monitoring period provides an acceptable margin for the evaluation unit 14 to determine whether or not oscillation has occurred.

During the predetermined monitoring period, the evaluation unit 14, via feedback circuit 18, compares the time derivative switching current $di_D/dt$ (e.g., $\Delta V$) to the predetermined negative threshold limit Ref1. If the time derivative switching current $di_D/dt$ (e.g., $\Delta V$) exceeds (i.e., is less than) the predetermined threshold limit Ref1 (Y), the boost time $T_{B1}$ of the switching acceleration for the next turn-on switching operation is reduced by a first adaptation time of a first predetermined amount $\Delta T1$ (operation 415). For example, the boost time $T_{B1}$ may be decreased in this example by 5 ns. On the other hand, if the time derivative switching current $di_D/dt$ (e.g., $\Delta V$) does not exceed (i.e., is equal to or greater than) the predetermined threshold limit Ref1 (N), the boost time $T_{B1}$ of the switching acceleration for the next turn-on switching operation is increased by a second adaptation time of a second predetermined amount $\Delta T2$ (operation 420). For example, the boost time $T_{B1}$ is increased in this example by 5 ns. It will be appreciated that the first predetermined amount $\Delta T1$ and the first predetermined amount $\Delta T2$ may be equal or different amounts. Additionally, a higher adaptation time is conceivable, as is a reduced one. After operation 415 or 420, the evaluation unit 14 waits for the next boost pulse BP1 and the method repeats. Thus, the boost time $T_{B1}$ may be adjusted after each boost pulse BP1 for the next turn-on switching event and therefore dynamically regulated according to the real-time operating point.

One of the advantages of the method 400 is that no prior knowledge of the operating point is required. No variables such as DC link voltage, temperature, or switching current have to be measured. Only the time derivative switching current $di_D/dt$ or its corresponding parameter $\Delta V$ is measured based on Ohm's Law ($di_D/dt=\Delta V/L$). Therefore, it is not necessary to create a detailed description or listing for the operating point dependency of the boost time $T_{B1}$ of the switching acceleration. This saves development effort and necessary hardware implementation in the application.

In addition, the degree of discretization $\Delta T1$ and $\Delta T2$ of the target value for the boost time $T_{B1}$ can be set as finely as desired within certain limits, so that there is an optimal match between the set duration and the duration of the switching acceleration required for the respective operating point. This ensures that the target value criterion is met for the lowest switching losses that can be achieved. It is also important that parameter fluctuations that are always present do not cause any problems, since they are always adapted to the respective situation.

In view of the above, method 400 enables a simple implementation of the cancellation of the target value conflict between the tendency to oscillate and the switching losses of SiC MOSFETs. It can be applied to possible realizations of a two-stage or multi-stage control of the SiC MOSFET.

Figure 5:
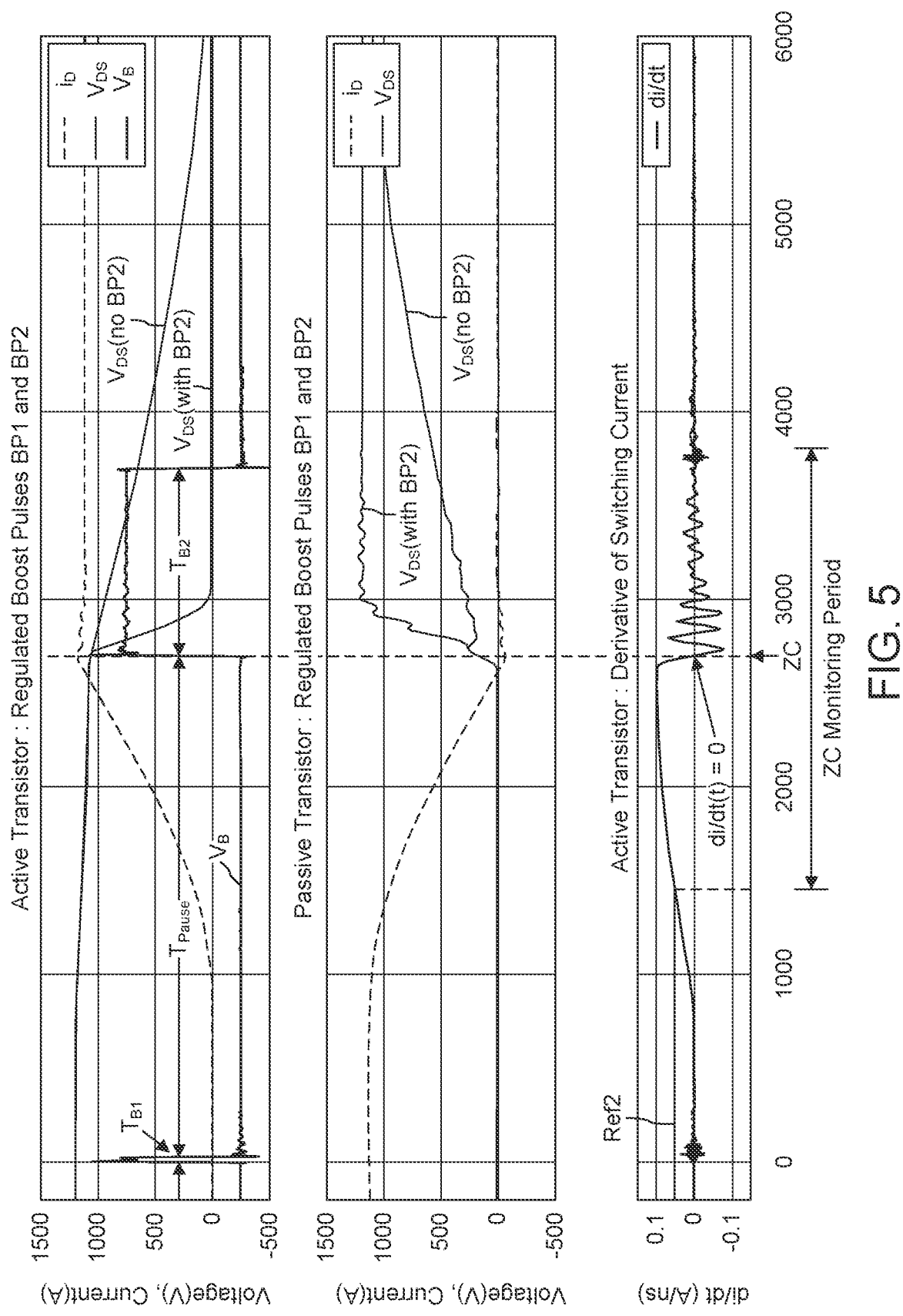
FIG. 5 is directed to a switching event for an active power transistor and a passive power transistor and illustrates normalized waveforms of the drain-source voltage $V_{DS}$ and the drain current $i_D$, as well as illustrates the corresponding time derivative switching current diD/dt of the active power transistor using fast switching and a regulated acceleration duration $T_{B2}$ according to one or more embodiments.

FIG. 5 is directed to a turn-on switching event. The top diagram of FIG. 5 illustrates normalized waveforms of the drain-source voltage $V_{DS}$ and the drain current $i_D$ of an active transistor of a half-bridge using fast switching and a regulated acceleration duration $T_{B2}$ according to one or more embodiments. The middle diagram of FIG. 5 illustrates normalized waveforms of the drain-source voltage $V_{DS}$ and the drain current $i_D$ of a passive transistor of the half-bridge using fast switching and a regulated acceleration duration $T_{B2}$ according to one or more embodiments. The bottom diagram of FIG. 5 illustrates the corresponding time derivative switching current $di_D/dt$ of the active transistor using fast switching and a regulated acceleration duration $T_{B2}$ according to one or more embodiments.

The entire turn-on switching process includes the di/dt phase, during which the drain current $i_D$ increases from zero to its maximum peak (i.e., reverse recovery peak), and a subsequent dv/dt phase, during which the drain-source voltage $V_{DS}$ begins to decrease steeply. The start of the dv/dt phase occurs substantially at the reverse recovery peak of the drain current $i_D$. In other words, the dv/dt phase starts at the end of the di/dt phase.

Although the di/dt phase is accelerated by the turn-on boost pulse BP1, the switching speed in the dv/dt phase is comparable to the slow, purely resistive switching with resistor R1. This leads to a massive turn-on loss increase. For example, drain-source voltage $V_{DS}$ of the active transistor is shown with and without the second boost pulse BP2 being implemented in FIG. 5. Without the second boost pulse BP2 being implemented, the drain-source voltage $V_{DS}$ of the active transistor slowly transitions from the high, DC link voltage to approximately 0V during turn-on. However, with the second boost pulse BP2 being implemented, the slope of drain-source voltage $V_{DS}$ of the active transistor can be increased in order to accelerate the transition of the drain-source voltage $V_{DS}$ of the active transistor to 0V. The transition increase of the drain-source voltage $V_{DS}$ of the passive transistor is also accelerated by the second boost pulse BP2.

Therefore, it is purposeful to implement a second phase of switching acceleration after the pause period Tpause to accelerate the dv/dt phase (i.e., to increase the slope of $V_{DS}$ of both active and passive transistors during the dv/dt phase). Since the dv/dt phase of the switch-on process starts with the reverse recovery of the active transistor 10, the reverse recovery time for the switching acceleration of the dv/dt phase can be used to trigger the second boost pulse BP2. Reverse recovery of the active transistor 10 starts at the reverse recovery peak of the drain current $i_D$ of the active transistor, which further coincides with a falling edge zero-crossing (ZC) of the time derivative switching current $di_D/dt$ of the active transistor during the turn-on switching process. This falling edge corresponds to the falling edge of the negative peak of $di_D/dt$ of greatest magnitude. Once again, parameter $\Delta V$ being proportional to $di_D/dt$ ($di_D/dt=\Delta V/L$) can be used to detect the falling edge zero-crossing (ZC) of the time derivative switching current $di_D/dt$ of the active transistor.

A trigger time at which a boost pulse BP2 is triggered is determined by the evaluation unit 14. The evaluation unit 14 may be configured to control the boost pulse BP2 to have a predetermined or fixed boost duration $T_{B2}$ for all turn-on switching events. The triggering of the boost pulse BP2 occurs in a current turn-on switching event based on the monitoring of the feedback information (e.g., the time derivative switching current $di_D/dt$ or $\Delta V$) measured during that same turn-on switching event. The boost pulse BP2 may be generated after a pause period Tpause that follows boost pulse BP1. Since the trigger time of boost pulse PB2 can vary based on the feedback information, the length of the pause period Tpause between boost pulses BP1 and BP2 can also vary.

Once the boost duration $T_{B2}$ of the switching acceleration has lapsed, the evaluation unit 14 switches the turn-on driver 16b to a low (negative or zero) control voltage via control signal 15b, ending the boost pulse BP2 according to the controlled boost duration $T_{B2}$. Once the control voltage at the turn-on driver 16b is switched low, the directional diode D2 becomes reverse-biased and prevents further current flow (source) to the turn-on driver 16b, so that it no longer participates in the turn-on switching process. In other words, the turn-on switching process is braked to the speed of the control of the primary driver 16a once the turn-on driver 16b is deactivated.

The ZC monitoring period for detecting this falling edge zero-crossing (ZC) may start once the time derivative switching current $di_D/dt$ or $\Delta V$ increases to a predetermined positive threshold value Ref2. Accordingly, the evaluation circuit 14 starts monitoring for the zero-crossing (ZC) once $di_D/dt$ or $\Delta V$ is greater than (more positive) the positive threshold value Ref2. The reverse recovery peak occurs at the first zero-crossing (ZC) of the time derivative switching current $di_D/dt$ or $\Delta V$ that follows the crossing of the positive threshold value Ref2. The evaluation circuit 14 should wait for the crossing of the positive threshold value Ref2 to start its monitoring for the zero-crossing (ZC) to allow sufficient time for $di_D/dt$ or $\Delta V$ to increase away from zero at the beginning of the turn-on switching process, and also to account for small oscillations in $di_D/dt$ or or $\Delta V$ that occur during the first boost pulse BP1. The positive threshold value Ref2 can be set to a lower value if the first boost pulse BP1 is not implemented or not used at all. In either case, using the positive threshold value Ref2 to trigger the ZC monitoring period prevents the second boost pulse BP2 from being triggered prior to the reverse recovery peak. If the first boost pulse BP1 is not implemented, the ZC monitoring period may start with the start of the turn-on switching event (i.e., to coincide with the rising edge of the pulse of the primary driver 16a).

Thus, the evaluation circuit 14 can use the time derivative switching current $di_D/dt$ or $\Delta V$ for triggering the second boost pulse BP2 by comparing the time derivative switching current $di_D/dt$ or $\Delta V$ to a second predetermined limit of zero. In other words, the evaluation circuit 14 monitors the time derivative switching current $di_D/dt$ or $\Delta V$ for its first zero-crossing (when $di_D/dt$ or $\Delta V$ equals or crosses zero) during the ZC monitoring period, and immediately triggers the second boost pulse BP2 in response to detecting the first zero-crossing (ZC). The first zero-crossing (ZC) in the ZC monitoring period will be a falling edge crossing of $di_D/dt$ or $\Delta V$.

The end of the pause period Tpause or the start of the dv/dt acceleration phase is initiated by this zero-crossing of the di/dt signal or $\Delta V$. It can be seen that the acceleration of the dv/dt phase realizes both a much faster switching speed and an almost unchanged drain current oscillation. Thus, the zero-crossing of the di/dt signal or $\Delta V$ is defined as the trigger for the start of the second switching acceleration (i.e., of the second boost pulse BP2). The duration of the second switching acceleration $T_{B2}$ has little effect on the technique. It only has to be set to a sufficiently high constant value. This length of boost duration $T_{B2}$ is reached when the switching process is completely finished after the dv/dt acceleration is accomplished in all operating points. In other words, length of boost duration $T_{B2}$ is set such that $V_{DS}$ is driven to zero for all operating points.

The triggered control is implemented in the dv/dt phase of the turn-on process to find the reverse recovery timing. When the zero-crossing is detected, the second acceleration of the turn-on process starts with the duration $T_{B2}$. Due to the signal propagation time of real components, there is inevitably a systematic delay time Tdelay between triggering the second boost pulse BP2 and the realization of the second boost pulse BP2. Nevertheless, trigger signal for generating the second boost pulse BP2 is immediately triggered in response to the detection of the zero-crossing.

Figure 6:
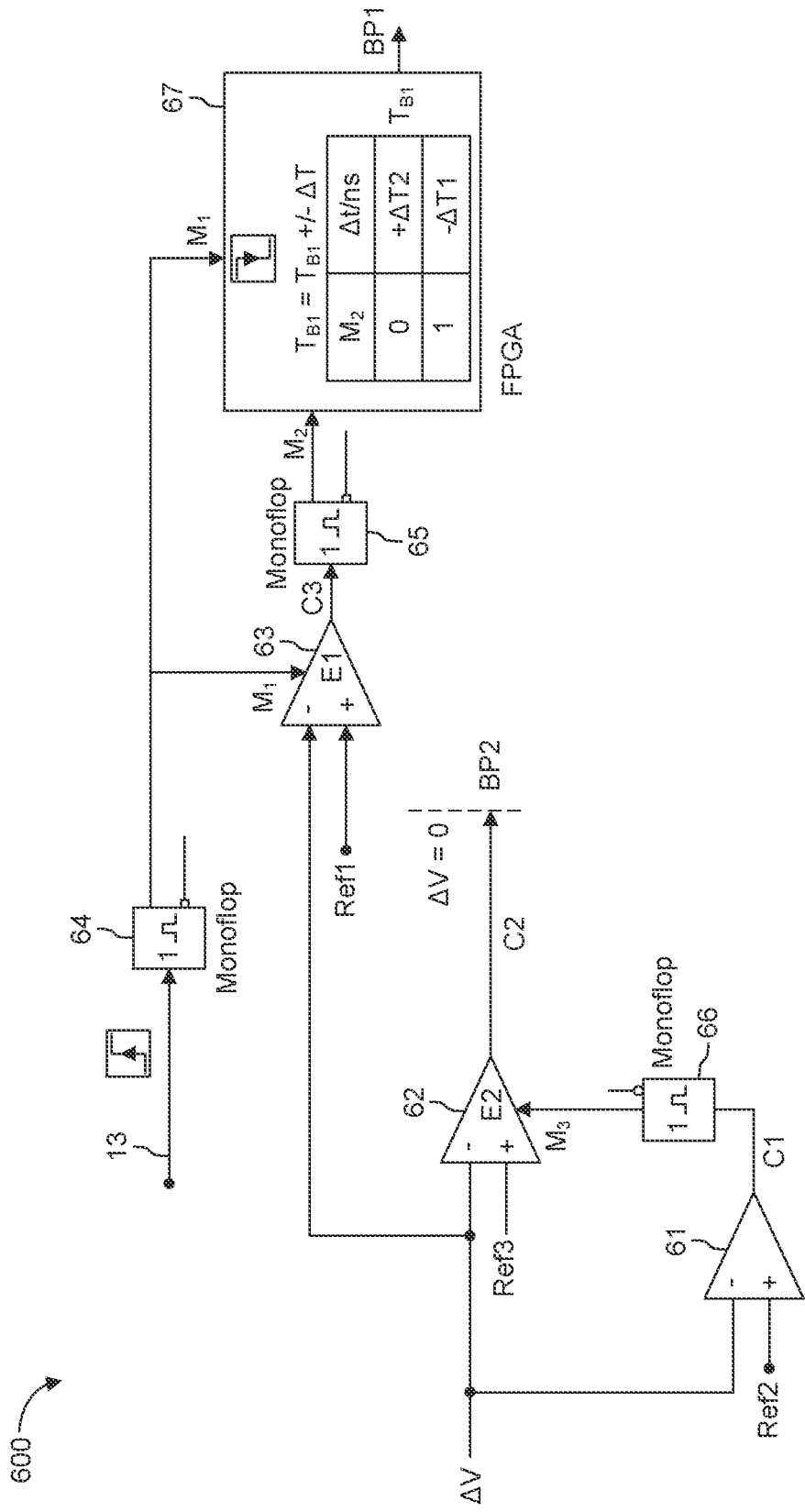
FIG. 6 is a schematic block diagram of a monitoring and detection circuit according to one or more embodiments.

FIG. 6 is a schematic block diagram of a monitoring and detection circuit 600 according to one or more embodiments. In particular, the monitoring and detection circuit 600 is implemented in the evaluation unit 14 for monitoring the time derivative switching current $di_D/dt$ or its corresponding $\Delta V$ value, comparing it to one or more thresholds (e.g., Ref1, Ref2, Ref3), and triggering one or more boost pulses BP1 and/or BP2 based on the threshold detection. In this example, it will be assumed that ΔV, which is proportional to $di_D/dt$ ($di_D/dt=ΔV/L$), is used for regulating BP1 and BP2. The monitoring and detection circuit 600 includes comparators 61, 62, and 63 that each compare ΔV to a respective threshold (e.g., Ref1, Ref2, and Ref3) for controlling the generation of boost pulses BP1 and BP2. Thus, comparator 19 in FIGS. 2A-2C is representative of one or more of the comparators in FIG. 6. Alternatively, if $di_D/dt$ is calculated from ΔV, $di_D/dt$ could be input to comparators 61, 62, and 63 and compared to respective thresholds. The monitoring and detection circuit 600 also includes monoflops 64, 65, and 66 and a look-up table 67 of an FPGA.

When a turn-on switching process is initiated (e.g., via control signal 13), output M1 of the first monoflop 64 is set high to activate comparator 63 for oscillation detection and to activate the look-up table 67. Here, the oscillation monitoring period starts at the beginning of the current turn-on switching event but may also start at the falling edge of the first boost pulse BP1. When the turn-on switching process is initiated (e.g., via control signal 13), the current value for boost duration $T_{B1}$ set in the look-up table 67 is used for generating the first boost pulse BP1 for the current turn-on switching event.

Comparator 63 is activated when a high signal M1 is received at its supply terminal E1 with a voltage that is sufficiently high to operate the comparator 63. With comparator 63 activated, comparator 63 continuously compares ΔV to Ref1 to assess the oscillation strength in this current turn-on switching event. The boost time $T_{B1}$ is updated in a look-up table according to method 400 for the next turn-on switching event after the oscillation monitoring period has expired.

On the condition that ΔV exceeds (i.e., becomes less than) the negative threshold value Ref1 during the oscillation monitoring period, output C3 of comparator 63 goes high and the output M2 of the second monoflop 65 is set high, triggering an incremental decrease to boost time $T_{B1}$ by ΔT1 for the next turn-on switching event. On the condition that ΔV does not exceed (i.e., remains equal to or greater than) the negative threshold value Ref1 during the oscillation monitoring period, the output of comparator 63 remains low and the output of the second monoflop 65 is set low, triggering an incremental increase to boost time $T_{B1}$ by ΔT2 for the next turn-on switching event. The duration of the oscillation monitoring period is set by the time constant of the RC network in the first monoflop 64. All the monoflops can also be implemented by digital signal processing (e.g., an FPGA).

Comparators 61 and 62 are used for triggering the second boost pulse BP2 of a constant boost duration $T_{B2}$. First, the output of comparator 61 is used to activate comparator 62. The output C1 of comparator 61 is set high when ΔV exceeds (i.e., is greater than) the positive threshold value Ref2, which indicates a start of the ZC monitoring period. Because there can be some small oscillation in ΔV during the generation of the first boost pulse BP1, the threshold value Ref2 is set to a value greater than a maximum positive amplitude of ΔV that is expected during the oscillation of ΔV during the first boost pulse. Thus, it can be ensured that there is no false detection of the dv/dt phase caused by the first boost pulse BP1 and that the ZC monitoring period begins after ΔV is sufficiently high. The start of the dv/dt phase is detected at the first zero-crossing of ΔV that occurs after ΔV is detected to have reached or exceeded the positive threshold value Ref2.

The duration of the ZC monitoring period is set by the time constant of the RC network in the third monoflop 66. When the output C1 of comparator 61 goes high, the output M3 of the third monoflop 66 is set high with a voltage that is sufficiently high to operate comparator 62. Comparator 62 is activated when a high signal M3 is received at its supply terminal E2 with a voltage that is sufficiently high to operate the comparator 62.

The predetermined threshold value Ref3 may be set to zero or a slightly negative value (e.g., substantially zero between 0 and ±(Ref1*0.2)) sufficient to detect a zero-crossing of ΔV and consequently the start of the dv/dt phase. With comparator 62 activated, comparator 62 continuously compares ΔV to Ref3 to detect the reverse recovery time (i.e., the reverse recovery peak) which occurs at the zero-crossing of ΔV. The output C2 of comparator 62 is used as a trigger signal for triggering the second boost pulse BP2. Thus, when $di_D/dt$ is equal to or becomes less than the threshold value Ref3, the output C2 goes high and the second boost pulse BP2 is triggered. Further second boost pulses are prevented until the next turn-on switching event. Thus, comparator 62 is used to detect a maximum reverse recovery current of the reverse recovery phase, which occurs at the ΔV zero crossing. The ZC monitoring period may be set to a predetermined time interval and the duration of the second boost pulse BP2 is pre-programmed as a predetermined length.

Figure 7:
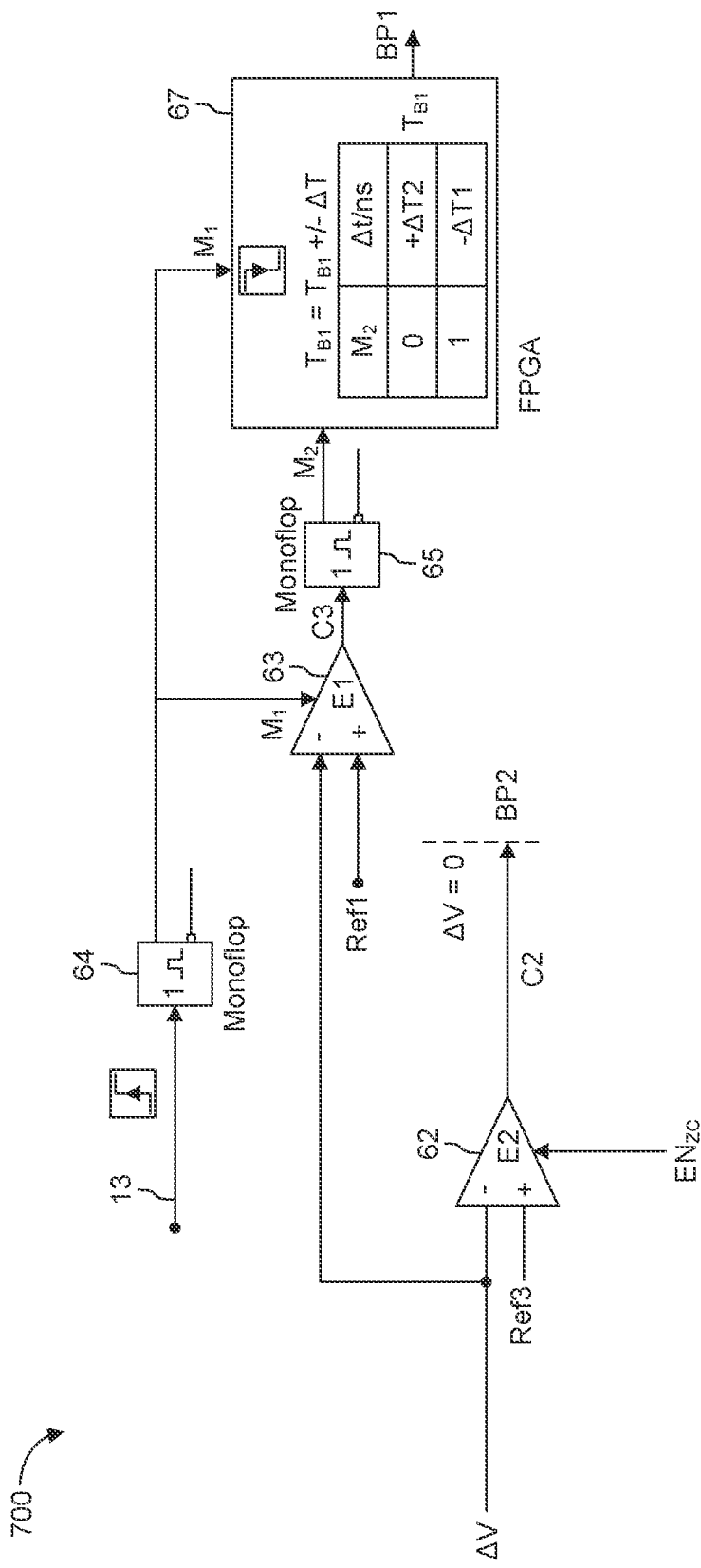
FIG. 7 is a schematic block diagram of another monitoring and detection circuit according to one or more embodiments.

FIG. 7 is a schematic block diagram of a monitoring and detection circuit 700 according to one or more embodiments. In particular, the monitoring and detection circuit 700 is similar to the monitoring and detection circuit 600 with the exception as to how comparator 62 is activated to start the ZC monitoring period. Here, the evaluation unit 14 triggers an enable signal ENzc at the falling edge of the first boost pulse BP1, which is known based on the look-up table 67. The value of ΔV should be a positive value at the end of the first boost pulse BP1 and the first falling edge zero-crossing of ΔV thereafter should occur at the start of the dv/dt phase. Thus, the enable signal ENzc is used to activate the comparator 62, thereby starting the ZC monitoring period. The enable signal ENzc may be deactivated when the first falling edge zero-crossing is detected during the ZC monitoring period, thereby deactivating comparator 62 as one way to prevent additional boost pulses from being triggered.

As described above, the predetermined threshold value Ref3 may be set to zero or a slightly negative value (e.g., substantially zero between 0 and ±(Ref1*0.2)) sufficient to detect a zero-crossing of ΔV and consequently the start of the dv/dt phase. With comparator 62 activated, comparator 62 continuously compares ΔV to Ref3 to detect the maximum reverse recovery current (i.e., the reverse recovery peak) which occurs at the zero-crossing of ΔV. The output C2 of comparator 62 is used as a trigger signal for triggering the second boost pulse BP2. Thus, when ΔV is equal to or becomes less than the threshold value Ref3, the output C2 goes high and the second boost pulse BP2 is triggered. Further second boost pulses are prevented until the next turn-on switching event. Thus, comparator 62 is used to detect the maximum reverse recovery current, which is determined by the ΔV zero crossing that follows the first boost pulse. The ZC monitoring period may be set to a predetermined time interval and the duration of the second boost pulse BP2 is pre-programmed as a predetermined length.

Figure 8:
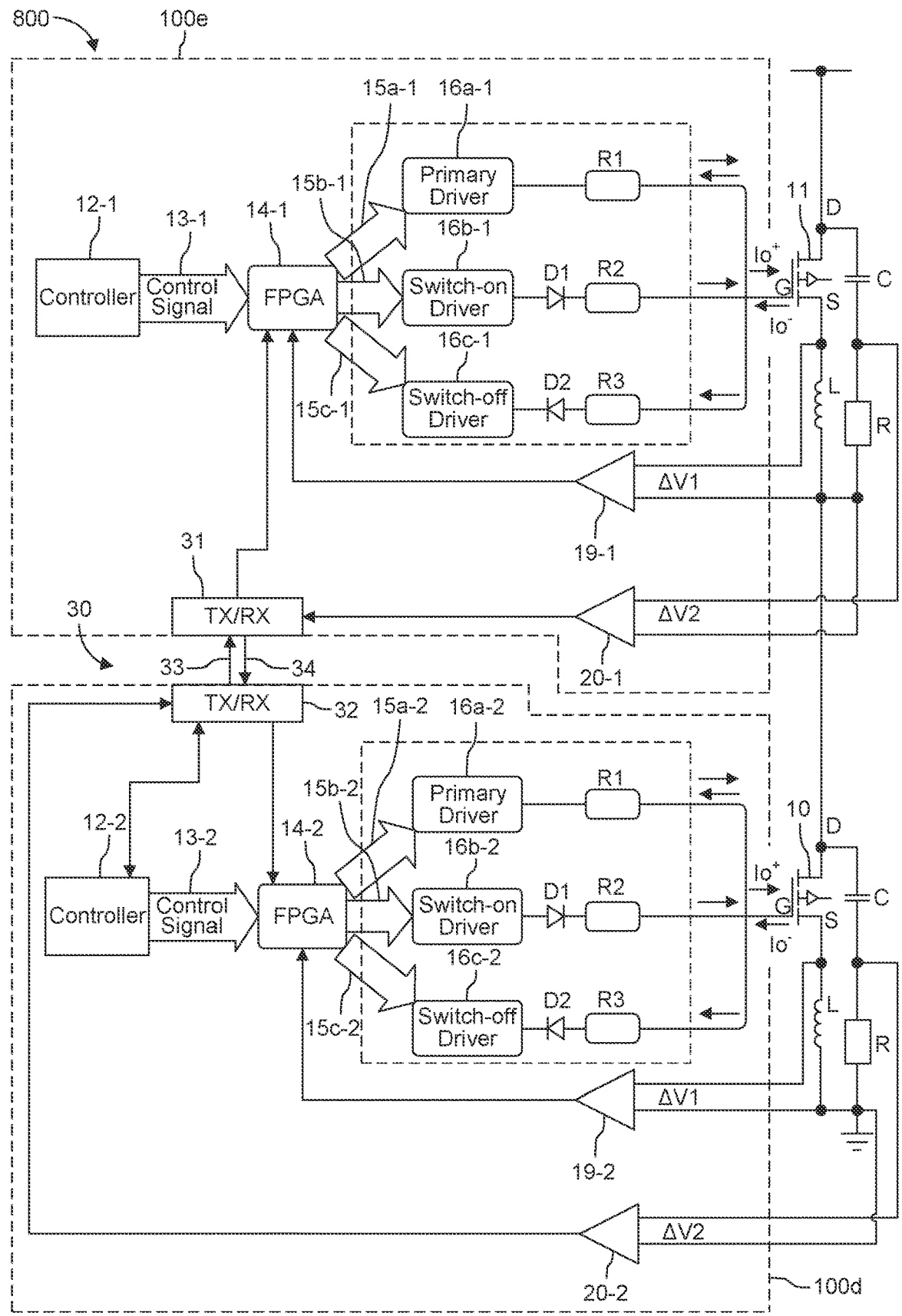
FIG. 8 is a schematic diagram of the gate driver system for a transistor half-bridge according to one or more embodiments.

FIG. 8 is a schematic diagram of the gate driver system 800 for a transistor half-bridge according to one or more embodiments. The half bridge includes a low-side power transistor 10 and a high-side power transistor 11. The gate driver system 800 includes gate drivers for each power transistor. Specifically, the gate driver system 800 includes a gate driver circuit 100*d* that drives the low-side power transistor 10 and a gate driver circuit 100*e* that drives the high-side power transistor 11.

In this example, the gate driver circuits 100*d* and 100*e* include driver circuitry comprising elements 12-16, R1, R2, R3, D1, and D2 similar to that shown in FIGS. 2A-2C. In addition, the gate driver circuits 100*d* and 100*e* include measurement circuitry that includes both the inductor L measurement circuit from FIG. 2A for measuring a current oscillation at an active transistor and an RC measurement circuit from FIG. 2B for measuring a voltage oscillation at a passive transistor that can be used as an indicator of a current oscillation at its complementary active transistor.

The gate driver circuits 100*d* and 100*e* are provided in duplicate, having similar components, including 12-1, 13-1, 14-1, 15*a*-1. 15*b*-1, 15*c*-1, 16*a*-1, 16*b*-1, 16*c*-1, 19-1, 20-1, 12-2, 13-2, 14-2, 15*a*-2. 15*b*-2, 15*c*-2, 16*a*-2, 16*b*-2, 16*c*-2, 19-2, and 20-2, respectively. Referring to FIG. 8, in view of FIGS. 2A and 2B, equivalent or like elements or elements with equivalent or like functionality are denoted with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

The gate driver circuits 100*d* and 100*e* operate in different voltage domains. Thus, they are separated by an isolation region 30, also referred to as a termination region. The gate driver circuits 100*d* and 100*e* may be integrated on a single die or may be on separate dies. The gate driver circuits 100*d* and 100*e* each include a corresponding transceiver (TX/RX) 31 and 32 for transmitting and receiving signals across the isolation region 30. A one or more level shifters 33 may be provided in the isolation region 30 for signals transmitted from transceiver 32 to transceiver 31 and one or more level shifters 34 may be provided in the isolation region 30 for signals transmitted from transceiver 31 to transceiver 32. The level shifters 33 and 34 are configured to convert signals from one voltage level corresponding to one voltage domain to another voltage level corresponding to the other voltage domain.

It is also noted that while two controllers 12-1 and 12-2 are shown, it is also conceivable that only controller 12-2 is provided. In such a case, the controller 12-2 may transmit control signals to the evaluation unit 14-1 through the isolation region 30 via transceivers 31 and 32. Likewise, the evaluation unit 14-1 may transmit signals to the controller 12-2 or to the evaluation unit 14-2 through the isolation region 30 via transceivers 31 and 32.

Comparator 19-1 of the high-side gate driver is similar to comparator 19 of FIG. 2B. It can be used to monitor $\Delta V1$ (i.e., proportional to di/dt) corresponding to transistor 11 when transistor 11 is the active transistor for regulating boost pulses BP1 and BP2 implemented by the FPGA 14-1. Like comparator 19, comparator 19-1 is a comparator circuit that can be expanded to represent comparators 61, 62, and 63 described in FIGS. 6 and 7. Comparator 19-1 is configured to measure the voltage drop $\Delta V1$ across a stray inductance (i.e., proportional to di/dt) coupled in the load path of transistor 11 to monitor $\Delta V1$ against a reference threshold, as similarly illustrated and described in reference to FIG. 2A.

Comparator 19-2 of the low-side gate driver is similar to comparator 19 of FIG. 2B. It can be used to monitor $\Delta V1$ (i.e., proportional to di/dt) corresponding to transistor 10 when transistor 10 is the active transistor for regulating boost pulses BP1 and BP2 implemented by the FPGA 14-2. Like comparator 19, comparator 19-2 is a comparator circuit that can be expanded to represent comparators 61, 62, and 63 described in FIGS. 6 and 7. Comparator 19-2 is configured to measure the voltage drop $\Delta V1$ across a stray inductance (i.e., proportional to di/dt) coupled in the load path of transistor 10 to monitor $\Delta V1$ against a reference threshold, as similarly illustrated and described in reference to FIG. 2A.

Comparator 20-1 of the high-side gate driver is also similar to comparator 19 of FIG. 2B in that it can also be expanded to represent comparators 61, 62, and 63 described in FIGS. 6 and 7. However, comparator 20-1 is used to monitor for an oscillation at transistor 11 when the transistor 11 is being turned off and acting as the passive transistor in order to detect an oscillation at transistor 10 that is being turned on and acting as the active transistor. In other words, comparator 20-1 can be used to monitor $\Delta V2$ corresponding to transistor 11 when transistor 11 is the passive transistor for regulating one or both boost pulses BP1 and BP2 of transistor 10 implemented by the FPGA 14-2.

If $\Delta V2$ at the high-side experiences an oscillation that violates an oscillation condition during turn-off, it can be inferred from FIG. 3A that transistor 10 at the low-side also experiences an oscillation in its load current that violates an oscillation condition during its complementary turn-on. For example, similar to comparator 63, comparator 20-1 can be configured to detect a voltage oscillation in $V_{DS}$ of transistor 11 (i.e., the passive transistor) during its turn-off and output its comparison result as an oscillation indication when $\Delta V$ exceeds a threshold. However, instead of transmitting the comparison result to evaluation unit 14-1, like comparator 19-1, comparator 20-1 transmits the comparison result to evaluation unit 14-2 (i.e., the evaluation unit of the active transistor 10) through the isolation region 30 via transceivers 31 and 32. The evaluation unit 14-2 is configured to receive the comparison result from comparator 20-1 and regulate the boost pulse duration TB1 of the first boost pulse BP1 of transistor 10 for its next turn-on switching event based on the comparison result from comparator 20-1 in a similar manner described above (see e.g., FIG. 4). Thus, in this case, $\Delta V$ measured for transistor 11 (i.e., the passive transistor) represents a transistor parameter indicative of an oscillation of a load current flowing through transistor 10 (i.e., the active transistor) for a turn-on switching event during which the transistor 10 is transitioned to an on state. $\Delta V$ measured for transistor 11 by comparator 20-1 during turn-off of transistor 11 and turn-on of transistor 10 can be used to detect the voltage oscillation at transistor 11 and the current oscillation at transistor 10. The voltage oscillation of the passive transistor is used to determine how to drive the active transistor in the next turn-on switching event of the active transistor.

If transmission across the isolation region 30 is fast enough, comparator 20-1 could also be used in a similar manner as comparator 62. In such a case, the comparison result of comparator 20-1 can be used to regulate the trigger time of boost pulse BP2 for transistor 10 during a turn-on switching event of transistor 10, with transistor 11 acting as the passive transistor.

Comparator 20-2 of the low-side gate driver is also similar to comparator 19 of FIG. 2B in that it can also be expanded to represent comparators 61, 62, and 63 described in FIGS. 6 and 7. However, comparator 20-2 is used to monitor for an oscillation at transistor 10 when the transistor 10 is being turned off and acting as the passive transistor in order to detect an oscillation at transistor 11 that is being turned on and acting as the active transistor. In other words, comparator 20-2 can be used to monitor ΔV (i.e., di/dt) corresponding to transistor 10 when transistor 10 is the passive transistor for regulating one or both boost pulses BP1 and BP2 of transistor 11 implemented by the FPGA 14-1.

If ΔV2 at the low-side experiences an oscillation that violates an oscillation condition during turn-off, it can be inferred from FIG. 3A that transistor 11 at the high-side also experiences an oscillation in its load current that violates an oscillation condition during its complementary turn-on. For example, similar to comparator 63, comparator 20-2 can be configured to detect a voltage oscillation in $V_{DS}$ of transistor 10 (i.e., the passive transistor) during its turn-off and output its comparison result as an oscillation indication when ΔV exceeds a threshold. However, instead of transmitting the comparison result to evaluation unit 14-2, like comparator 19-2, comparator 20-2 transmits the comparison result to evaluation unit 14-1 (i.e., the evaluation unit of the active transistor 11) through the isolation region 30 via transceivers 31 and 32. The evaluation unit 14-1 is configured to receive the comparison result from comparator 20-2 and regulate the boost pulse duration TB1 of the first boost pulse BP1 of transistor 11 for its next turn-on switching event based on the comparison result from comparator 20-2 in a similar manner described above (see e.g., FIG. 4). Thus, in this case, ΔV measured for transistor 10 (i.e., the passive transistor) represents a transistor parameter indicative of an oscillation of a load current flowing through transistor 11 (i.e., the active transistor) for a turn-on switching event during which the transistor 11 is transitioned to an on state. ΔV measured for transistor 10 by comparator 20-2 during turn-off of transistor 10 and turn-on of transistor 11 can be used to detect the voltage oscillation at transistor 10 and the current oscillation at transistor 11. The voltage oscillation of the passive transistor is used to determine how to drive the active transistor in the next turn-on switching event of the active transistor.

If transmission across the isolation region 30 is fast enough, comparator 20-2 could also be used in a similar manner as comparator 62. In such a case, the comparison result of comparator 20-2 can be used to regulate the trigger time of boost pulse BP2 for transistor 11 during a turn-on switching event of transistor 11, with transistor 10 acting as the passive transistor.

Additional embodiments are provided below.

1. A gate driver system configured to drive a transistor between switching states in a power circuit, the gate driver system comprising:

a gate driver circuit coupled to a gate terminal of the transistor and configured to control a gate voltage at the gate terminal in order to drive the transistor between the switching states, the gate driver circuit configured to generate an on-current during a plurality of turn-on switching events to turn on the transistor, wherein the gate driver circuit includes a first driver configured to source a first portion of the on-current to the gate terminal to charge a first portion of the gate voltage, wherein the gate driver circuit includes a second driver configured to, during a first boost interval, source a second portion of the on-current to the gate terminal to charge a second portion of the gate voltage; and a control circuit configured to measure a transistor parameter indicative of an oscillation of a load current for a first turn-on switching event during which the transistor is transitioned to an on state and control the first driver to source the first portion of the on-current and to control the second driver to source the second portion of the on-current, wherein the control circuit is further configured to regulate a length of the first boost interval based on the measured transistor parameter.

2. The gate driver system of embodiment 1, wherein the control circuit is configured to monitor the measured transistor parameter over an oscillation monitoring period of the first turn-on switching event and regulate the length of the first boost interval for a subsequent turn-on switching event based on the monitoring of the measured transistor parameter over the oscillation monitoring period.

3. The gate driver system of embodiment 2, wherein the oscillation monitoring period is a predefined portion of the first turn-on switching event and the control circuit is configured to update the length of the first boost interval for the subsequent turn-on switching event during an interval between the oscillation monitoring period and the subsequent turn-on switching event.

4. The gate driver system of embodiment 1, wherein the second driver is configured to activate a flow of the second portion of the on-current at a start of the first boost interval for the length of the first boost interval and deactivate the flow of the second portion of the on-current at an end of the first boost interval to stop the flow of the second portion of the on-current.

5. The gate driver system of embodiment 1, wherein the transistor parameter is a time derivative of a load current of the transistor or a load path parameter of the transistor that is proportional to the time derivative of the load current of the transistor.

6. The gate driver system of embodiment 5, wherein the control circuit is configured to compare the transistor parameter to a negative threshold value to generate a comparison result, and regulate the length of the first boost interval based on the comparison result.

7. The gate driver system of embodiment 6, wherein:

during the first turn-on switching event, the control circuit is configured to compare the transistor parameter to the negative threshold value to generate the comparison result, and the control circuit is configured to regulate the length of the first boost interval for a subsequent turn-on switching event based on the comparison result.

8. The gate driver system of embodiment 6, wherein:

the control circuit is configured to initiate a comparison of the transistor parameter to the negative threshold value at a start of an oscillation monitoring period of the first turn-on switching event, and monitor the comparison during the oscillation monitoring period of the first turn-on switching event, the comparison result indicating whether or not the transistor parameter became less than the negative threshold value at any point during the oscillation monitoring period of the first turn-on switching event.

9. The gate driver system of embodiment 6, wherein:

the comparison result indicates whether or not the transistor parameter became less than the negative threshold value during an oscillation monitoring period of the first turn-on switching event, on a first condition that the transistor parameter became less than the negative threshold value during the oscillation monitoring period of the first turn-on switching event, the control circuit is configured to decrease the length of the first boost interval for a subsequent turn-on switching event, and on a second condition that the transistor parameter did not become less than the negative threshold value during the oscillation monitoring period of the first turn-on switching event, the control circuit is configured to increase the length of the first boost interval for the subsequent turn-on switching event.

10. The gate driver system of embodiment 5, wherein the control circuit comprises:

a comparator configured to measure a voltage difference across a stray inductance that is coupled in series to the transistor and through which the load current flows, the voltage difference being the load path parameter of the transistor that is proportional to the time derivative of the load current of the transistor, and a processing circuit configured to convert the measured voltage difference to the time derivative of the load current.

11. The gate driver system of embodiment 5, wherein the time derivative of a load current corresponds to an operating point of the transistor that changes based on a load that is driven by the transistor.

12. The gate driver system of embodiment 1, wherein the second portion of the on-current is a boost on current that supplements the first portion of the on-current.

13. The gate driver system of embodiment 1, wherein the second portion of the on-current is larger than the first portion of the on-current.

14. The gate driver system of embodiment 1, wherein the first driver is configured to maintain the transistor in the on state until a turn-off switching event.

15. The gate driver system of embodiment 1, wherein the first driver is configured to provide an on-current to the gate terminal during a plurality of turn-on switching events to turn on the transistor.

16. The gate driver system of embodiment 1, wherein the first boost interval occurs during a portion of a transient interval of the gate voltage caused by the transistor transitioning from an off state to the on state.

17. The gate driver system of embodiment 1, further comprising:

a first current path coupled between the gate terminal and the first driver through which the first portion of the on-current flows; and a second current path coupled in parallel to the first current path between the gate terminal and the second driver through which the second portion of the on-current flows.

18. The gate driver system of embodiment 1, wherein the transistor is a silicon carbide (SiC) power transistor.

19. The gate driver system of embodiment 1, wherein:

the second driver is configured to, during a second boost interval, source a third portion of the on-current to the gate terminal to charge a third portion of the gate voltage, and the control circuit is configured to control the second driver to source the third portion of the on-current, wherein the control circuit is further configured regulate a trigger time of the second boost interval based on the measured transistor parameter, wherein the trigger time of the second boost interval is a time at which the second driver initiates sourcing of the third portion of the on-current to the gate terminal.

20. The gate driver system of embodiment 19, wherein a length of the second boost interval is fixed and the length of the first boost interval is variable over the plurality of turn-on switching events.

21. The gate driver system of embodiment 19, wherein a trigger time of the first boost interval is fixed and the trigger time of the second boost interval is variable over the plurality of turn-on switching events.

22. The gate driver system of embodiment 19, wherein the first boost interval and the second boost interval are separated by a pause interval during which the second driver does not source current to the gate terminal.

23. The gate driver system of embodiment 22, wherein a length of the pause interval is variable over the plurality of turn-on switching events based on the trigger time of the second boost interval and based on the length of the first boost interval.

24. The gate driver system of embodiment 19, wherein the control circuit is configured to monitor the measured transistor parameter over a zero-crossing monitoring period of the first turn-on switching event and regulate the trigger time of the second boost interval within the zero-crossing monitoring period of the first turn-on switching event based on the monitoring of the measured transistor parameter over the zero-crossing monitoring period.

25. The gate driver system of embodiment 19, wherein the second driver is configured to activate a flow of the third portion of the on-current at the trigger time of the second boost interval and deactivate the flow of the third portion of the on-current at an end of the second boost interval to stop the flow of the third portion of the on-current.

26. The gate driver system of embodiment 19, wherein the transistor parameter is a time derivative of a load current of the transistor or a load path parameter of the transistor that is proportional to the time derivative of the load current of the transistor.

27. The gate driver system of embodiment 26, wherein the control circuit is configured to compare the transistor parameter to zero or substantially zero to detect a zero-crossing of the transistor parameter, and regulate the trigger time of the second boost interval based on the detection of the zero-crossing.

28. The gate driver system of embodiment 27, wherein:

the control circuit is configured monitor for the zero-crossing of the transistor parameter during a zero-crossing monitoring period of the first turn-on switching event, and trigger the second driver to start sourcing the third portion of the on-current to the gate terminal in response to detecting the zero-crossing of the transistor parameter.

29. The gate driver system of embodiment 28, wherein the control circuit is configured to detect the zero-crossing of the transistor parameter when the transistor parameter becomes less than zero on a falling slope.

30. The gate driver system of embodiment 28, wherein the control circuit is configured to detect the zero-crossing of the transistor parameter at a first instance the transistor parameter becomes equal to or less than zero during the zero-crossing monitoring period.

31. The gate driver system of embodiment 19, wherein the third portion of the on-current is a boost on current that supplements the first portion of the on-current.

32. The gate driver system of embodiment 19, wherein the third portion of the on-current is larger than the first portion of the on-current.

33. A method of driving a transistor between switching states in a power circuit, the method comprising:

generating an on-current during a plurality of turn-on switching events to control a gate voltage at a gate terminal of the transistor, wherein generating the on-current includes sourcing a first portion of the on-current to the gate terminal to charge a first portion of the gate voltage, and sourcing, during a boost interval, a second portion of the on-current to the gate terminal to charge a second portion of the gate voltage;

measuring a transistor parameter indicative of an oscillation of a load current of the transistor for a first turn-on switching event during which the transistor is transitioned to an on state;

activating the first portion of the on-current for a second turn-on switching event; and activating the second portion of the on-current for the second turn-on switching event, including regulating a length of the boost interval based on the measured transistor parameter.

34. The method of embodiment 33, wherein the transistor parameter is a time derivative of a load current of the transistor or a load path parameter of the transistor that is proportional to the time derivative of the load current of the transistor.

35. The method of embodiment 34, further comprising:
comparing the transistor parameter to a negative threshold value to generate a comparison result; and
regulating the length of the boost interval for the second turn-on switching event based on the comparison result, the second turn-on switching event being subsequent to the first turn-on switching event.

36. The method of embodiment 35, wherein the comparison result indicates whether or not the transistor parameter becomes less than the negative threshold value during an oscillation monitoring period of the first turn-on switching event, and the method further comprises:
on a first condition that the transistor parameter becomes less than the negative threshold value during the oscillation monitoring period of the first turn-on switching event, decreasing the length of the boost interval for the second turn-on switching event, and
on a second condition that the transistor parameter does not become less than the negative threshold value during the oscillation monitoring period of the first turn-on switching event.

37. A gate driver system configured to drive a transistor between switching states in a power circuit, the gate driver system comprising:
a gate driver circuit coupled to a gate terminal of the transistor and configured to control a gate voltage at the gate terminal in order to drive the transistor between the switching states, the gate driver circuit configured to generate an on-current during a plurality of turn-on switching events to turn on the transistor,
wherein the gate driver circuit includes a first driver configured to source a first portion of the on-current to the gate terminal to charge a first portion of the gate voltage,
wherein the gate driver circuit includes a second driver configured to, during a boost interval, source a second portion of the on-current to the gate terminal to charge a second portion of the gate voltage; and
a control circuit configured to measure a transistor parameter representative of a reverse recovery current of the transistor for a turn-on switching event during which the transistor is transitioned to an on state and control the first driver to source the first portion of the on-current and to control the second driver to source the second portion of the on-current, wherein the control circuit is further configured to receive the measured transistor parameter and regulate a trigger time of the boost interval based on the measured transistor parameter indicating an occurrence of a maximum reverse recovery current of the transistor, wherein the trigger time of the boost interval is a time at which the second driver initiates sourcing of the second portion of the on-current to the gate terminal.

38. The gate driver system of embodiment 37, wherein the start of the reverse recovery of the transistor occurs at a maximum peak of a load current of the transistor during the turn-on switching event.

39. The gate driver system of embodiment 37, wherein the trigger time of the boost interval is variable over the plurality of turn-on switching events.

40. The gate driver system of embodiment 37, wherein the control circuit is configured to monitor the measured transistor parameter over a zero-crossing monitoring period of the turn-on switching event and regulate the trigger time of the boost interval within the zero-crossing monitoring period of the turn-on switching event.

41. The gate driver system of embodiment 37, wherein the transistor parameter is a time derivative of a load current of the transistor or a load path parameter of the transistor that is proportional to the time derivative of the load current of the transistor.

42. The gate driver system of embodiment 41, wherein the control circuit is configured to compare the transistor parameter to zero or substantially zero to detect a zero-crossing of the transistor parameter, and regulate the trigger time of the boost interval based on the detection of the zero-crossing,
wherein the zero-crossing of the transistor parameter corresponds to a time instance at which the maximum reverse recovery current of the transistor occurs.

43. The gate driver system of embodiment 42, wherein:
the control circuit is configured monitor for the zero-crossing of the transistor parameter during a zero-crossing monitoring period of the turn-on switching event, and trigger the second driver to start sourcing the second portion of the on-current to the gate terminal in response to detecting the zero-crossing of the transistor parameter.

44. The gate driver system of embodiment 43, wherein the control circuit is configured to detect the zero-crossing of the transistor parameter when the transistor parameter becomes less than zero on a falling slope.

45. The gate driver system of embodiment 43, wherein the control circuit is configured to detect the zero-crossing of the transistor parameter at a first instance the transistor parameter becomes equal to or less than zero during the zero-crossing monitoring period.

46. The gate driver system of embodiment 37, wherein the second portion of the on-current is a boost on current that supplements the first portion of the on-current.

47. The gate driver system of embodiment 37, wherein the second portion of the on-current is larger than the first portion of the on-current.

48. A method of driving a transistor between switching states in a power circuit, the method comprising:
generating an on-current during a plurality of turn-on switching events to control a gate voltage at a gate terminal of the transistor,
wherein generating the on-current includes sourcing a first portion of the on-current to the gate terminal to charge a first portion of the gate voltage, and sourcing, during a boost interval, a second portion of the on-current to the gate terminal to charge a second portion of the gate voltage;

measuring a transistor parameter representative of a reverse recovery current of the transistor for a turn-on switching event during which the transistor is transitioned to an on state;

activating the first portion of the on-current for the turn-on switching event; and activating the second portion of the on-current for the turn-on switching event, including regulating a trigger time of the boost interval based on the measured transistor parameter indicating an occurrence of a maximum reverse recovery current of the transistor, wherein the trigger time of the boost interval is a time at which the second portion of the on-current to the gate terminal is initiated during the turn-on switching event.

49. A gate driver system configured to drive a load, the gate driver system configured to drive a half bridge circuit comprising a first transistor and a second transistor that are switched in a complementary manner, comprising:

a gate driver circuit coupled to a gate terminal of the second transistor and configured to control a gate voltage at the gate terminal in order to drive the second transistor between switching states of the second transistor, the gate driver circuit configured to generate an on-current during a plurality of switching events to turn on the second transistor, wherein the gate driver circuit includes a first driver configured to source a first portion of the on-current to the gate terminal to charge a first portion of the gate voltage, wherein the gate driver circuit includes a second driver configured to, during a first boost interval, source a second portion of the on-current to the gate terminal to charge a second portion of the gate voltage; and a measurement circuit configured to measure a transistor parameter of the first transistor during a first switching event during which the first transistor is transitioned to an off state and the second transistor is transitioned to an on state, wherein the transistor parameter is indicative of an oscillation at the second transistor during the first switching event, wherein the measurement circuit is configured to generate a signal that indicates whether or not the oscillation is present at the second transistor during the first switching event based on the measured transistor parameter of the first transistor.

50. The gate driver system of embodiment 49, further comprising:

a control circuit configured to control the first driver to source the first portion of the on-current and to control the second driver to source the second portion of the on-current, wherein the control circuit is further configured to receive the signal and regulate a length of the first boost interval based on the received signal.

51. The gate driver system of embodiment 50, wherein the control circuit is configured to monitor the signal over an oscillation monitoring period of the first switching event and regulate the length of the first boost interval for a subsequent switching event during which the second transistor is transitioned to an on state based on the monitoring of the signal over the oscillation monitoring period.

52. The gate driver system of embodiment 49, wherein:

the transistor parameter of the first transistor is measurable quantity indicative of a voltage oscillation across load terminals of the first transistor during the first switching event, and the oscillation at the second transistor is an oscillation in a load current flowing through the second transistor during first switching event.

53. The gate driver system of embodiment 49, wherein the second driver is configured to activate a flow of the second portion of the on-current at a start of the first boost interval for the length of the first boost interval and deactivate the flow of the second portion of the on-current at an end of the first boost interval to stop the flow of the second portion of the on-current.

54. The gate driver system of embodiment 50, wherein the measurement circuit is configured to compare the measured transistor parameter to a threshold value to generate a comparison result, and the control circuit is configured to regulate the length of the first boost interval based on the comparison result.

55. The gate driver system of embodiment 54, wherein:

the comparison result indicates whether or not the oscillation is present at the second transistor during the first switching event, on a first condition that the comparison result indicates that the oscillation is present at the second transistor during the first switching event, the control circuit is configured to decrease the length of the first boost interval for a subsequent switching event during which the second transistor is transitioned to an on state, and on a second condition that the comparison result indicates that the oscillation is not present at the second transistor during the first switching event, the control circuit is configured to increase the length of the first boost interval for the subsequent switching event during which the second transistor is transitioned to an on state.

While various embodiments have been disclosed, it will be apparent to those skilled in the art that various changes and modifications can be made which will achieve some of the advantages of the concepts disclosed herein without departing from the spirit and scope of the invention. For example, while is it noted that SiC MOSFETs generally switch so fast that oscillation is a recurring problem for SiC MOSFETs, embodiments may be applicable to any power semiconductor with a fast switching speed that encounters oscillation issues. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A gate driver system configured to drive a load, the gate driver system configured to drive a half bridge circuit comprising a first transistor and a second transistor, comprising:
   a gate driver circuit coupled to a gate terminal of the second transistor and configured to control a gate voltage at the gate terminal in order to drive the second transistor between switching states, the gate driver circuit configured to generate an on-current during a plurality of switching events to turn on the second transistor,
   wherein the gate driver circuit includes a first driver configured to source a first portion of the on-current to the gate terminal to charge a first portion of the gate voltage,
   wherein the gate driver circuit includes a second driver configured to, during a first boost interval, source a second portion of the on-current to the gate terminal to charge a second portion of the gate voltage; and
   a measurement circuit configured to measure a transistor parameter of the first transistor during a first switching event during which the first transistor is transitioned to an off state and the second transistor is transitioned to an on state, wherein the transistor parameter is indicative of an oscillation at the second transistor during the first switching event, wherein the measurement circuit is configured to generate a signal that indicates whether or not the oscillation is present at the second transistor during the first switching event based on the measured transistor parameter of the first transistor.

2. The gate driver system of claim 1, further comprising:
   a control circuit configured to control the first driver to source the first portion of the on-current and to control the second driver to source the second portion of the on-current, wherein the control circuit is further configured to receive the signal and regulate a length of the first boost interval based on the received signal.

3. The gate driver system of claim 2, wherein the control circuit is configured to monitor the signal over an oscillation monitoring period of the first switching event and regulate the length of the first boost interval for a subsequent switching event during which the second transistor is transitioned to an on state based on the monitoring of the signal over the oscillation monitoring period.

4. The gate driver system of claim 1, wherein:
   the transistor parameter of the first transistor is measurable quantity indicative of a voltage oscillation across load terminals of the first transistor during the first switching event, and
   the oscillation at the second transistor is an oscillation in a load current flowing through the second transistor during the first switching event.

5. The gate driver system of claim 1, wherein the second driver is configured to activate a flow of the second portion of the on-current at a start of the first boost interval for a length of the first boost interval and deactivate the flow of the second portion of the on-current at an end of the first boost interval to stop the flow of the second portion of the on-current.

6. The gate driver system of claim 2, wherein the measurement circuit is configured to compare the measured transistor parameter to a threshold value to generate a comparison result, and the control circuit is configured to regulate the length of the first boost interval based on the comparison result.

7. The gate driver system of claim 6, wherein:
   the comparison result indicates whether or not the oscillation is present at the second transistor during the first switching event,
   on a first condition that the comparison result indicates that the oscillation is present at the second transistor during the first switching event, the control circuit is configured to decrease the length of the first boost interval for a subsequent switching event during which the second transistor is transitioned to an on state, and
   on a second condition that the comparison result indicates that the oscillation is not present at the second transistor during the first switching event, the control circuit is configured to increase the length of the first boost interval for the subsequent switching event during which the second transistor is transitioned to an on state.

8. A method of driving a half bridge circuit comprising a first transistor and a second transistor, the method comprising:
   controlling a gate voltage at a gate terminal of the second transistor in order to drive the second transistor between switching states, including generating an on-current during a plurality of turn-on switching events to turn on the second transistor;
   measuring a transistor parameter of the first transistor during a first switching event during which the first transistor is transitioned to an off state and the second transistor is transitioned to an on state, wherein the transistor parameter is indicative of an oscillation at the second transistor during the first switching event;
   generating a signal that indicates whether or not the oscillation is present at the second transistor during the first switching event based on the measured transistor parameter of the first transistor; and
   controlling the on-current based on the signal that indicates whether or not the oscillation is present at the second transistor.

\* \* \* \* \*